United States Patent [19]
Kaminaga et al.

[11] Patent Number: 5,471,095
[45] Date of Patent: Nov. 28, 1995

[54] SEMICONDUCTOR INTEGRATED CIRCUIT DEVICE AND METHOD OF FABRICATING SAME

[75] Inventors: Isamu Kaminaga; Shuuichi Matsue; Takahiko Arakawa; Shuuichi Katoh; Masahiro Ueda, all of Itami, Japan

[73] Assignee: Mitsubishi Denki Kabushiki Kaisha, Tokyo, Japan

[21] Appl. No.: 237,309

[22] Filed: May 3, 1994

[30] Foreign Application Priority Data

May 10, 1993 [JP] Japan ..................................... 5-107877

[51] Int. Cl.[6] .............................. H01L 23/48; H01L 29/62
[52] U.S. Cl. ........................................... 257/775; 257/777
[58] Field of Search ..................................... 257/775, 777

[56] References Cited

U.S. PATENT DOCUMENTS

| | | | |
|---|---|---|---|
| 5,018,005 | 5/1991 | Lin et al. | 257/775 |
| 5,083,186 | 1/1992 | Okada et al. | 257/775 |

OTHER PUBLICATIONS

T. Sakurai and K. Tamaru, "Simple Formulas for Two- and Three-Dimensional Capacitances", IEEE Transactions on Electron Devices, v. ED-30, No. 2, Feb. 1983, pp. 183–185.

Primary Examiner—Stephen D. Meier
Attorney, Agent, or Firm—Oblon, Spivak, McClelland, Maier, & Neustadt

[57] ABSTRACT

There is disclosed a semiconductor integrated circuit device including an element-to-element line (10A) of a quadrangular (rectangular) configuration in cross section having horizontal upper and lower surfaces, with its lower surface corners on the side of a semiconductor substrate (1) chamfered on the slant. This increases the horizontal distance between adjacent lines and decreases the height of the line, permitting the adjacent line-to-line parasitic capacitance to be lower than that of the prior art line of a quadrangular configuration in cross section under the same height and line-to-line horizontal distance conditions. The line-to-substrate parasitic capacitance is also permitted to be lower for similar reasons. The semiconductor integrated circuit device is thus provided in which the parasitic capacitances generated by forming lines are minimized.

3 Claims, 31 Drawing Sheets

FIG. 12
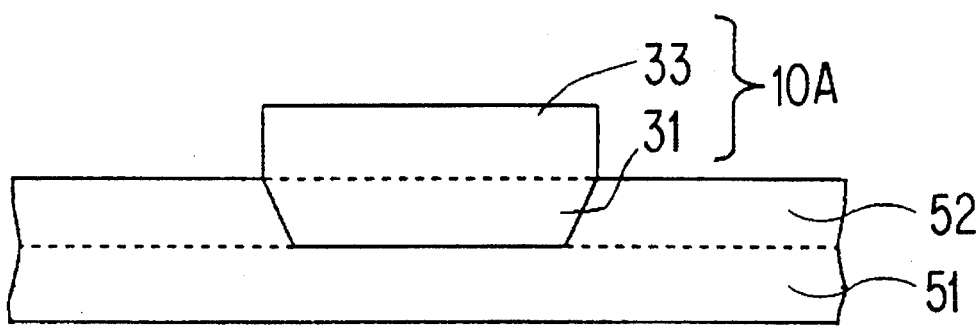
FIG. 13
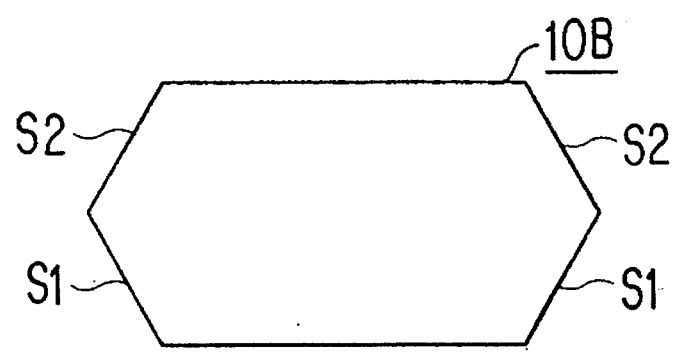
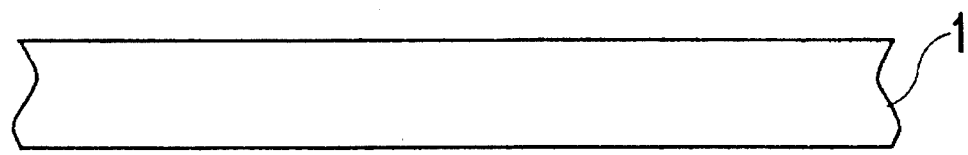

FIG. 27
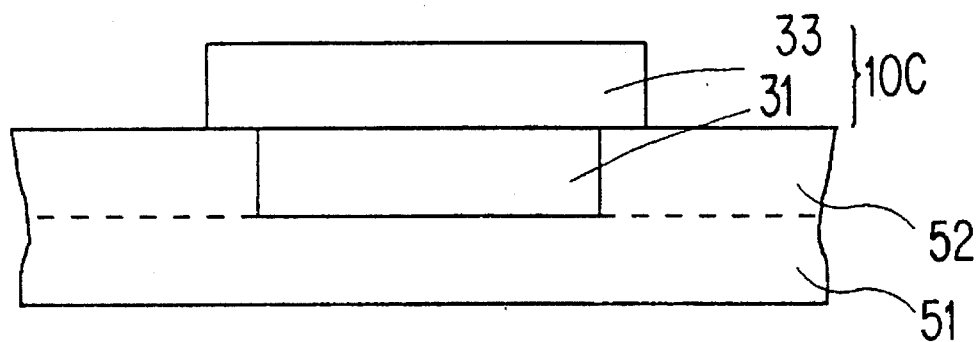
FIG. 28
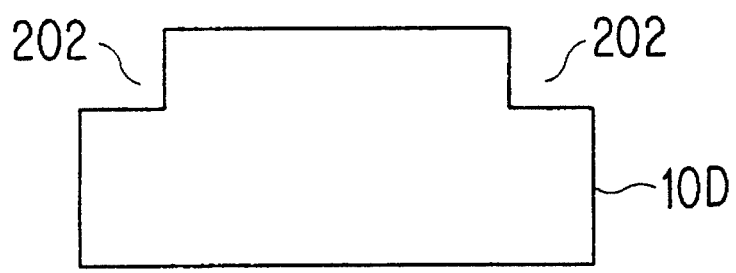

FIG. 41
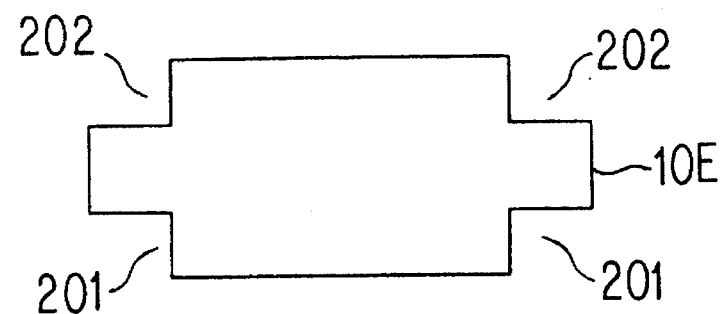
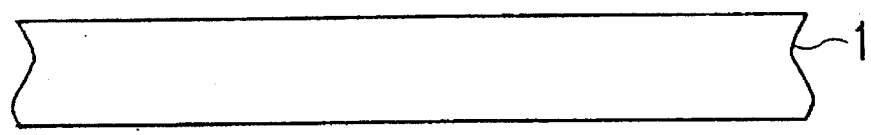
FIG. 42
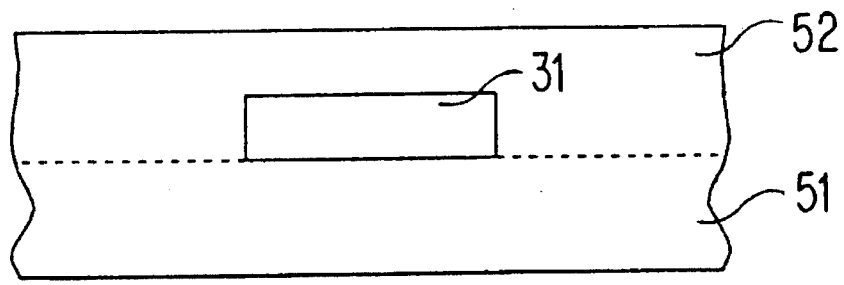

SEMICONDUCTOR INTEGRATED CIRCUIT DEVICE AND METHOD OF FABRICATING SAME

BACKGROUND OF THE INVENTION

1. Field of the Invention

The present invention relates to a semiconductor integrated circuit device and more particularly to a cross-sectional configuration of an element-to-element line for electrically connecting semiconductor elements to each other.

2. Description of the Background Art

FIG. 56 is a cross-sectional view of an inner portion of a conventional semiconductor integrated circuit device. Semiconductor elements 2 and 3 are formed on the surface of a semiconductor substrate 1, as shown in FIG. 56. The semiconductor element 2 is a transistor including diffusion regions 101, 102, an insulating film 103 and a gate electrode 104, and the semiconductor element 3 is a diffused resistor including a diffusion region 105. The semiconductor elements 2 and 3 are connected electrically to each other with an element-to-element line 4, as shown. Reference numeral 5 designates a protective film, and 6 to 9 designate other lines.

As above described, the semiconductor elements 2 and 3 are formed on the semiconductor substrate 1, and the element-to-element line is formed for electrically connecting the semiconductor elements, to provide the semiconductor integrated circuit device.

FIG. 57 is a cross-sectional view taken along the line A—A of FIG. 56. The ordinary element-to-element line 4 is of a quadrangular (rectangular) configuration configuration in cross section having horizontal portions at its upper and lower surfaces, as shown in FIG. 57.

FIG. 58 schematically illustrates parasitic capacitances generated by forming lines. An adjacent line-to-line parasitic capacitance C1 is generated between adjacent lines 41 and 42, an adjacent line-to-line parasitic capacitance C2 is generated between adjacent lines 42 and 43, and a substrate-to-line parasitic capacitance C3 is generated between the line 42 and the semiconductor substrate 1.

The parasitic capacitances have not presented a serious problem in the prior art semiconductor manufacturing technique because of its large design size. However, as recent rapid advance of the manufacturing technique has caused the design size to be finer, the parasitic capacitances due to two-dimensional size of lines have not been negligible compared with capacitances of materials.

Consequently, the increase in the parasitic capacitances due to the line formation causes a reduction in operating speeds of the semiconductor integrated circuit device and an increase in power consumption.

SUMMARY OF THE INVENTION

The present invention is intended for a semiconductor integrated circuit device including a plurality of semiconductor elements formed on a semiconductor substrate. According to the present invention, the semiconductor integrated circuit device comprises: an element-to-element line for electrically connecting the plurality of semiconductor elements to each other, the element-to-element line being of a quadrangular configuration in cross section having horizontal upper and lower surfaces, with its lower surface corners chamfered on the slant.

As above described, in the semiconductor integrated circuit device of the present invention, the element-to-element line has the quadrangular configuration in cross section having the horizontal upper and lower surfaces, with its lower surface corners chamfered on the slant, to increase the horizontal distance between adjacent lines in the chamfering portion and decrease the line height in the chamfering portion. This reduces the adjacent line-to-line parasitic capacitance generated between the horizontally adjacent lines.

In addition, the vertical distance between the line in the chamfering portion and the semiconductor substrate lying therebelow is increased, and the line width in the chamfering portion is decreased. This reduces the line-to-substrate parasitic capacitance generated between the line and the semiconductor substrate.

According to another aspect of the present invention, the semiconductor integrated circuit device comprises: an element-to-element line for electrically connecting the plurality of semiconductor elements to each other, the element-to-element line being of a hexagonal configuration in cross section having horizontal upper and lower surfaces.

In the semiconductor integrated circuit device of the second aspect of the present invention, the element-to-element line has the hexagonal configuration in cross section having the horizontal upper and lower surfaces, to increase the horizontal distance between adjacent lines at the surfaces adjacent the upper or lower surface and to decrease the line height. This reduces the adjacent line-to-line parasitic capacitance.

In addition, the vertical distance between the line at the surfaces adjacent the lower surface and the semiconductor substrate is increased and the line width is decreased. This reduces the line-to-substrate parasitic capacitance.

The vertical distance between the line at the surfaces adjacent the upper surface and an overlying line is increased and the line width is decreased. This reduces the multilayer line-to-line parasitic capacitance generated between the line and the overlying line.

According to a third aspect of the present invention, the semiconductor integrated circuit device comprises: an element-to-element line for electrically connecting the plurality of semiconductor elements to each other, the element-to-element line being of a quadrangular configuration in cross section having horizontal upper and lower surfaces, with its lower surface corners removed at right angles.

In the semiconductor integrated circuit device of the third aspect of the present invention, the element-to-element line has the quadrangular configuration in cross section having the horizontal upper and lower surfaces, with its lower surface corners removed at right angles, to increase the horizontal distance between adjacent lines in the removal portion and to decrease the line height. This reduces the adjacent line-to-line parasitic capacitance.

In addition, the vertical distance between the line in the removal portion and the semiconductor substrate lying therebelow is increased and the line width is decreased. This reduces the line-to-substrate parasitic capacitance.

According to a fourth aspect of the present invention, the semiconductor integrated circuit device comprises: an element-to-element line for electrically connecting the plurality of semiconductor elements to each other, the element-to-element line being of a quadrangular configuration in cross section having horizontal upper and lower surfaces, with its upper surface corners removed at right angles.

In the semiconductor integrated circuit device of the fourth aspect of the present invention, the element-to-element line has the quadrangular configuration in cross section having the horizontal upper and lower surfaces, with its upper surface corners removed at right angles, to increase the horizontal distance between adjacent lines in the removal portion and to decrease the line height. This reduces the adjacent line-to-line parasitic capacitance.

In addition, the vertical distance between the line in the removal portion and an overlying line is increased and the line width is decreased. This reduces the multilayer line-to-line parasitic capacitance.

According to a fifth aspect of the present invention, the semiconductor integrated circuit device comprises: an element-to-element line for electrically connecting the plurality of semiconductor elements to each other, the element-to-element line being of a quadrangular configuration in cross section having horizontal upper and lower surfaces, with its upper and lower surface corners removed at right angles.

In the semiconductor integrated circuit device of the fifth aspect of the present invention, the element-to-element line has the quadrangular configuration in cross section having the horizontal upper and lower surfaces, with its upper and lower surface corners removed at right angles, to increase the horizontal distance between adjacent lines in the removal portions and to decrease the line height. This reduces the adjacent line-to-line parasitic capacitance.

In addition, the vertical distance between the line in the removal portion at the lower surface and the semiconductor substrate lying therebelow is increased and the line width is decreased. This reduces the line-to-substrate parasitic capacitance.

Further, the vertical distance between the line in the removal portion at the upper surface and an overlying line is increased and the line width is decreased. This reduces the multilayer line-to-line parasitic capacitance.

According to a sixth aspect of the present invention, the semiconductor integrated circuit device comprises: an element-to-element line for electrically connecting the plurality of semiconductor elements to each other, the element-to-element line being of an inverted triangular configuration having an upper surface serving as a horizontal base and a vertex therebelow.

In the semiconductor integrated circuit device of the sixth aspect of the present invention, the element-to-element line has the inverted triangular configuration in cross section having the horizontal base at the upper surface and the vertex therebelow, to make the horizontal distance between adjacent lines longer in the downward direction from the upper surface and to decrease the line height. This reduces the adjacent line-to-line parasitic capacitance.

In addition, the vertical distance between the line and the semiconductor substrate lying therebelow is made longer in the upward direction from the vertex and the line width is decreased. This reduces the line-to-substrate parasitic capacitance.

The present invention is also intended for a method of fabricating a semiconductor integrated circuit device including a plurality of semiconductor elements formed on a semiconductor substrate. According to the present invention, the method comprises the steps of: forming a first protective film on the semiconductor substrate; forming a first wiring layer on the first protective film; forming a first resist on the first wiring layer; patterning the first resist; etching the first wiring layer using the first resist as a mask so as to taper from its upper surface to its lower surface and then removing the first resist; forming a second protective film over the first protective film and the first wiring layer; polishing the second protective film from the top surface to expose the upper surface of the first wiring layer; forming a second wiring layer over the top surface; forming a second resist on the second wiring layer; patterning the second resist to conform to the configuration of the upper surface of the first wiring layer; and vertically etching the second wiring layer using the second resist as a mask so that the lower surface of the second wiring layer conforms to the upper surface of the first wiring layer, to form an element-to-element line including the first and second wiring layers, whereby the element-to-element line for electrically connecting the plurality of semiconductor elements to each other is of a quadrangular configuration in cross section having horizontal upper and lower surfaces, with its lower surface corners chamfered on the slant.

In another aspect of the present invention, the method comprises the steps of: forming a first protective film on the semiconductor substrate; forming a first wiring layer on the first protective film; forming a first resist on the first wiring layer; patterning the first resist; etching the first wiring layer using the first resist as a mask so as to taper from its upper surface to its lower surface and then removing the first resist; forming a second protective film over the first protective film and the first wiring layer; polishing the second protective film from the top surface to expose the upper surface of the first wiring layer; forming a second wiring layer over the top surface; forming a second resist on the second wiring layer; patterning the second resist to conform to the configuration of the lower surface of the first wiring layer; and etching the second wiring layer using the second resist as a mask so as to taper from its lower surface to its upper surface so that the lower surface of the second wiring layer conforms to the upper surface of the first wiring layer, to form an element-to-element line including the first and second wiring layers, whereby the element-to-element line for electrically connecting the plurality of semiconductor elements to each other is of a hexagonal configuration in cross section having horizontal upper and lower surfaces.

In still another aspect of the present invention, the method comprises the steps of: forming a first protective film on the semiconductor substrate; forming a first wiring layer on the first protective film; forming a first resist on the first wiring layer; patterning the first resist; vertically etching the first wiring layer using the first resist as a mask and then removing the first resist; forming a second protective film over the first protective film and the first wiring layer; polishing the second protective film from the top surface to expose a surface of the first wiring layer; forming a second wiring layer over the top surface; forming a second resist on the second wiring layer; patterning the second resist to be wider than the first wiring layer; and vertically etching the second wiring layer using the second resist as a mask to form recesses at right angles between the first and second wiring layers, to form an element-to-element line including the first and second wiring layers, whereby the element-to-element line for electrically connecting the plurality of semiconductor elements is of a quadrangular configuration in cross section having horizontal upper and lower surfaces, with its lower surface corners removed at right angles.

In a further aspect of the present invention, the method comprises the steps of: forming a first protective film on the semiconductor substrate; forming a relatively thick wiring layer on the first protective film; forming a first resist on the wiring layer; patterning the first resist; vertically etching the wiring layer using the first resist as a mask and then removing the first resist; forming a second protective film over the first protective film and the wiring layer; polishing the second protective film from the top surface to expose a surface of the wiring layer; forming a second resist over the top surface; patterning the second resist so as to permit only an end portion of the wiring layer to be exposed; and vertically etching the wiring layer to a midway depth using the second resist as a mask, to form an element-to-element line including the wiring layer, whereby the element-to-element line for electrically connecting the plurality of semiconductor elements to each other is of a quadrangular configuration in cross section having horizontal upper and lower surfaces, with its upper surface corners removed at right angles.

In a still further aspect of the present invention, the method comprises the steps of: forming a first protective film on the semiconductor substrate; forming a first, relatively thin wiring layer on the first protective film; forming a first resist on the first wiring layer; patterning the first resist; vertically etching the first wiring layer using the first resist as a mask and then removing the first resist; forming a second protective film over the first protective film and the first wiring layer; polishing the second protective film from the top surface to expose a surface of the first wiring layer; forming a second wiring layer over the top surface; forming a second resist on the second wiring layer; patterning the second resist such that only a region of the second resist is left unremoved which lies above a central region of the first wiring layer other than an end region thereof; and vertically etching the second wiring layer using the second resist as a mask to form an element-to-element line including the first and second wiring layers, whereby the element-to-element line for electrically connecting the plurality of semiconductor elements to each other is of a quadrangular configuration in cross section having horizontal upper and lower surfaces, with its upper surface corners removed at right angles.

In another aspect of the present invention, the method comprises the steps of: forming a first protective film on the semiconductor substrate; forming a first, relatively thin wiring layer on the first protective film; forming a first resist on the first wiring layer; patterning the first resist; vertically etching the first wiring layer using the first resist as a mask and then removing the first resist; forming a second protective film over the first protective film and the first wiring layer; forming a second resist on the second protective film; patterning the second resist such that only a region of the second resist is removed which lies above a central region of the first wiring layer other than an end region thereof; etching the second protective film using the second resist as a mask until a surface of the first wiring layer is exposed; forming a second wiring layer over the top surface; and polishing the second wiring layer until a surface of the second protective film is exposed to form an element-to-element line including the first wiring layer and the remaining second wiring layer, whereby the element-to-element line for electrically connecting the plurality of semiconductor elements to each other is of a quadrangular configuration in cross section having horizontal upper and lower surfaces, with its upper surface corners removed at right angles.

In still another aspect of the present invention, the method comprises the steps of: forming a first protective film on the semiconductor substrate; forming a first wiring layer on the first protective film; forming a first resist on the first wiring layer; patterning the first resist; vertically etching the first wiring layer using the first resist as a mask and then removing the first resist; forming a second protective film over the first protective film and the first wiring layer; polishing the second protective film from the top surface to expose a surface of the first wiring layer; forming a second, relatively thick wiring layer over the top surface; forming a second resist on the second wiring layer; patterning the second resist to be wider than the first wiring layer; vertically etching the second wiring layer using the second resist as a mask and then removing the second resist to form recesses at right angles between the first and second wiring layers; forming a third protective film over the second protective film and the second wiring layer; polishing the third protective film from the top surface to expose a surface of the second wiring layer; forming a third resist over the top surface; patterning the third resist so as to permit only an end portion of the second wiring layer to be exposed; and vertically etching the second wiring layer to a midway depth using the third resist as a mask, to form an element-to-element line including the first and second wiring layer, whereby the element-to-element line for electrically connecting the plurality of semiconductor elements to each other is of a quadrangular configuration in cross section having horizontal upper and lower surfaces, with its upper and lower surface corners removed at right angles.

In another aspect of the present invention, the method comprises the steps of: forming a first protective film on the semiconductor substrate; forming a first wiring layer on the first protective film; forming a first resist on the first wiring layer; patterning the first resist; vertically etching the first wiring layer using the first resist as a mask and then removing the first resist; forming a second protective film over the first protective film and the first wiring layer; polishing the second protective film from the top surface to expose a surface of the first wiring layer; forming a second, relatively thin second wiring layer over the top surface; forming a second resist on the second wiring layer; patterning the second resist to be wider than the first wiring layer; vertically etching the second wiring layer using the second resist as a mask and then removing the second resist to form recessed at right angles between the first and second wiring layers; forming a third protective film over the second protective film and the second wiring layer; polishing the third protective film from the top surface to expose a surface of the second wiring layer; forming a third wiring layer over the top surface; forming a third resist on the third wiring layer; patterning the third resist such that only a region of the third resist is left unremoved which lies above a central region of the second wiring layer other than an end region thereof; and vertically etching the third wiring layer using the third resist as a mask to form an element-to-element line including the first, second and third wiring layers, whereby the element-to-element line for electrically connecting the semiconductor elements to each other is of a quadrangular configuration in cross section having horizontal upper and lower surfaces, with its upper and lower surface corners removed at right angles.

In still another aspect of the present invention, the method comprises the steps of: forming a first protective film on the semiconductor substrate; forming a first wiring layer on the first protective film; forming a first resist on the first wiring layer; patterning the first resist; vertically etching the first wiring layer using the first resist as a mask and then removing the first resist; forming a second protective film over the first protective film and the first wiring layer; polishing the second protective film from the top surface to expose a surface of the first wiring layer; forming a second, relatively thin wiring layer over the top surface; forming a second resist on the second wiring layer; patterning the second resist to be wider than the first wiring layer; vertically etching the second wiring layer using the second resist as a mask and then removing the second resist to form recesses at right angles between the first and second wiring layers; forming a third protective film over the second protective film and the second wiring layer; forming a third resist on the third protective film; patterning the third resist such that only a region of the third resist is removed which lies above a central region of the second wiring layer other than an end region thereof; etching the third protective film using the third resist as a mask until a surface of the second wiring layer is exposed; forming a third wiring layer over the top surface; and polishing the third wiring layer until a surface of the third protective film is exposed to form an element-to-element line including the first and second wiring layers and the remaining third wiring layer, whereby the element-to-element line for electrically connecting the plurality of semiconductor elements to each other is of a quadrangular configuration in cross section having horizontal upper and lower surfaces, with its upper and lower surface corners removed at right angles.

In still another aspect of the present invention, the method comprises the steps of: forming a first protective film on the semiconductor substrate; forming a wiring layer having upper and lower surfaces on the first protective film, the wiring layer being made of first and second materials, the ratio of the second material to the first material increasing in a direction from the upper surface to the lower surface up to about 100% adjacent the lower surface; forming a first resist on the wiring layer; patterning the first resist; and etching the wiring layer by means of an etchant effective for only the second material using the first resist as a mask such that a great part of the lower surface of the wiring layer is removed, to form an element-to-element line including the wiring layer, whereby the element-to-element line for electrically connecting the plurality of semiconductor elements to each other is of an inverted triangular configuration in cross section having an upper surface serving as a horizontal base and a vertex therebelow.

An object of the present invention is to provide a semiconductor integrated circuit device which minimizes parasitic capacitances generated by forming lines.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 to 12 are cross-sectional views showing a method of fabricating a line in the semiconductor integrated circuit device of the first preferred embodiment;

FIG. 13 is a cross-sectional view showing the cross-sectional configuration of the element-to-element line for the semiconductor integrated circuit device according to a second preferred embodiment of the present invention;

FIGS. 24 to 27 are cross-sectional views showing the method of fabricating the line in the semiconductor integrated circuit device of the third preferred embodiment;

FIG. 28 is a cross-sectional view showing the cross-sectional configuration of the element-to-element line for the semiconductor integrated circuit device according to a fourth preferred embodiment of the present invention;

FIG. 41 is a cross-sectional view showing the cross-sectional configuration of the element-to-element line for the semiconductor integrated circuit device according to a fifth preferred embodiment of the present invention;

FIGS. 42 to 46 are cross-sectional views showing the method of fabricating the line in the semiconductor integrated circuit device of the fifth preferred embodiment;

DESCRIPTION OF THE PREFERRED EMBODIMENTS

<First Preferred Embodiment>

Figure 1:
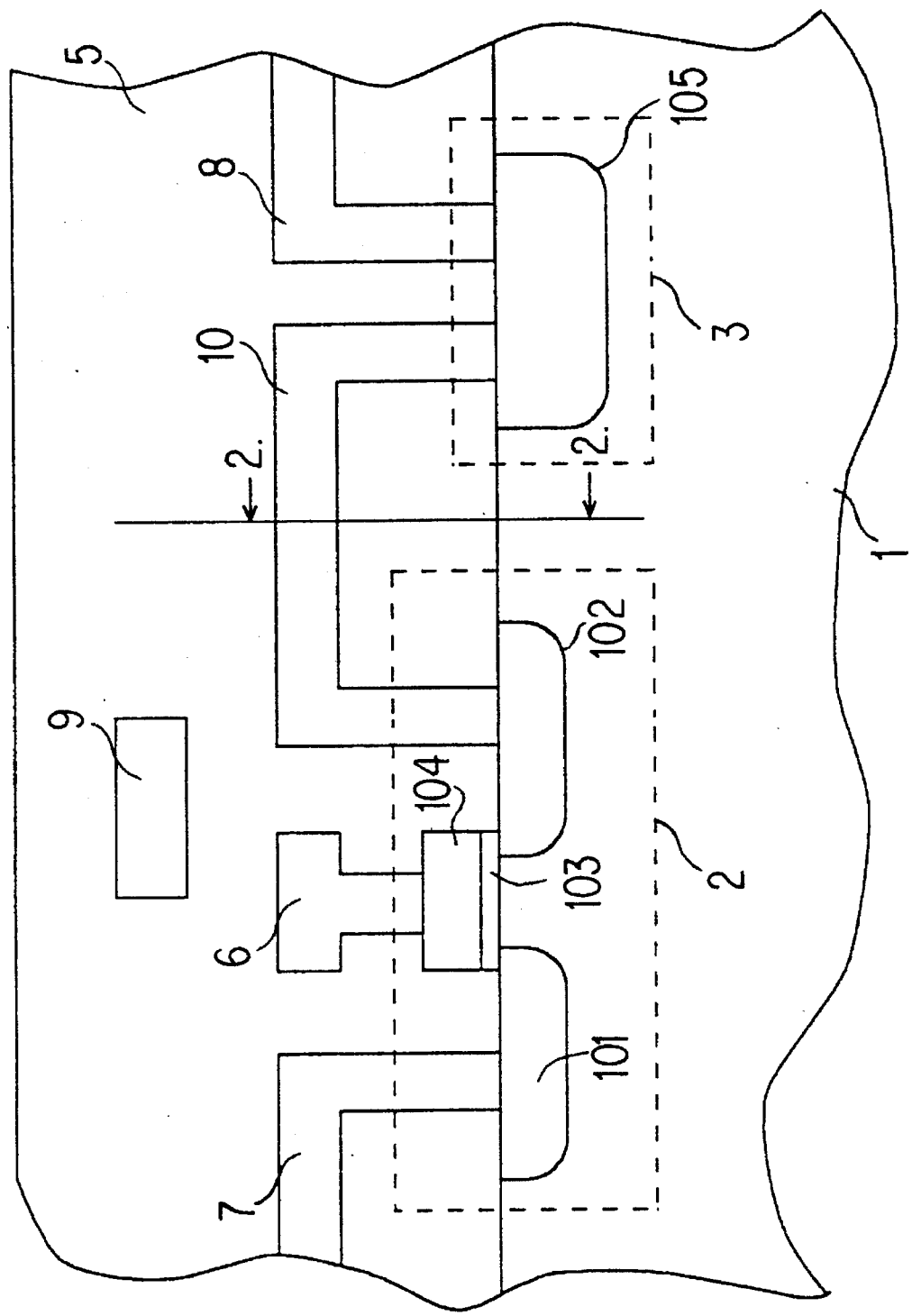
FIG. 1 is a cross-sectional view of a portion of a semiconductor integrated circuit device according to a first preferred embodiment of the present invention.

FIG. 1 is a fragmentary cross-sectional view of a semiconductor integrated circuit device according to a first preferred embodiment of the present invention. Semiconductor elements 2 and 3 are formed on the surface of a semiconductor substrate 1, as shown in FIG. 1. The semiconductor element 2 is a transistor including diffusion regions 101, 102, an insulating film 103, and a gate electrode 104, and the semiconductor element 3 is a diffused resistor including a diffusion region 105. As shown, the semiconductor elements 2 and 3 are connected electrically to each other with an element-to-element line 10. Reference numeral 5 designates a protective film, and 6 to 9 designate other lines.

As above described, the semiconductor elements, as designated at 2 and 3, are formed on the semiconductor substrate 1, and the element-to-element line is formed for electrically connecting the semiconductor elements, to provide the semiconductor integrated circuit device.

Figure 2:
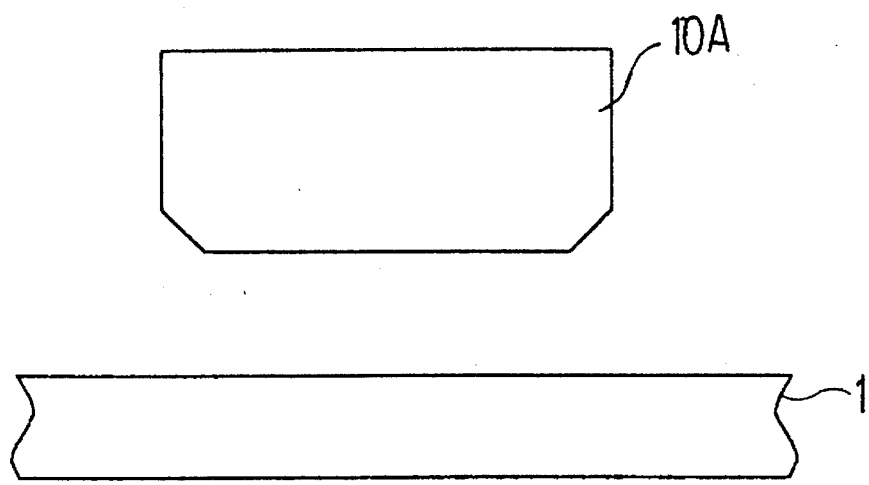
FIG. 2 is a cross-sectional view showing the cross-sectional configuration of an element-to-element line for the semiconductor integrated circuit device of the first preferred embodiment.

FIG. 2 is a cross-sectional view taken along the line B—B of FIG. 1. The element-to-element line 10 (10A) of the first preferred embodiment is of a quadrangular (rectangular) cross-sectional configuration having horizontal upper and lower surfaces, with its lower surface corners on the side of the semiconductor substrate 1 chamfered on the slant.

Figure 3:
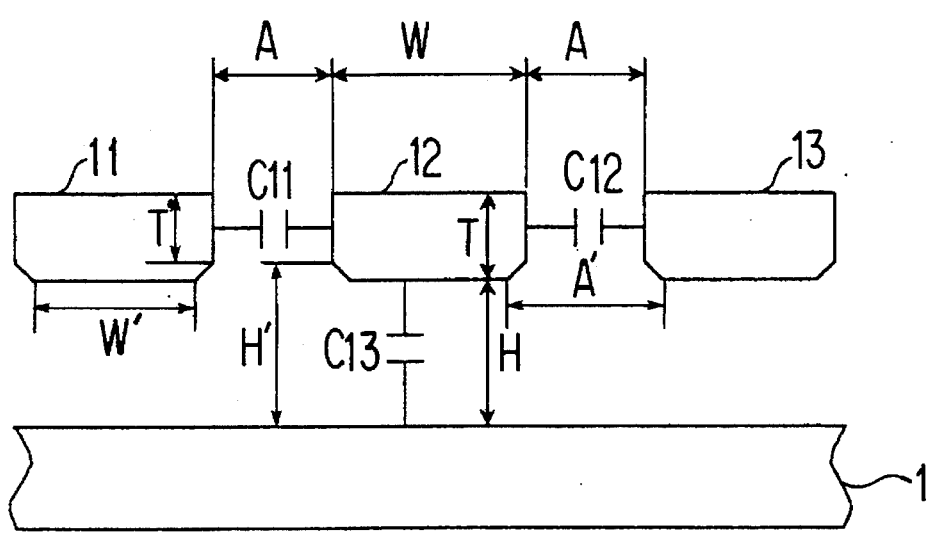
FIG. 3 illustrates parasitic capacitances generated by forming lines in the semiconductor integrated circuit device of the first preferred embodiment.

FIG. 3 schematically shows parasitic capacitances generated by forming lines for the semiconductor integrated circuit device of the first preferred embodiment. As shown, an adjacent line-to-line parasitic capacitance C11 is generated between adjacent lines 11 and 12, an adjacent line-to-line parasitic capacitance C12 is generated between adjacent lines 12 and 13, and a line-to-substrate parasitic capacitance C13 is generated between the line 12 and the semiconductor substrate 1.

The presence of the chamfering portions at the lower surfaces of the lines 11 to 13 permits the horizontal distance between the lines 11 (13) and 12 in the chamfering portions (a maximum of A') to be longer than the distance A and permits the height of the line 11 (12, 13) in the chamfering portions (a maximum of T') to be shorter than the height T, as shown in FIG. 3. This provides the adjacent line-to-line parasitic capacitances C11 and C12 which are lower than those of the prior art quadrangular (rectangular) lines in cross section having the height T and line-to-line distance A.

Likewise, the presence of the chamfering portions at the lower surfaces of the lines 11 to 13 permits the vertical distance between the line 12 in the chamfering portions and the semiconductor substrate 1 (a maximum of H') to be longer than the distance H and permits the width of the line 12 in the chamfering portions (a maximum of W') to be shorter than the width W, as shown in FIG. 3. This provides the line-to-substrate parasitic capacitance C13 which is lower than those of the prior art quadrangular (rectangular) lines in cross section having the width W and line-to-substrate distance H.

Figure 4:
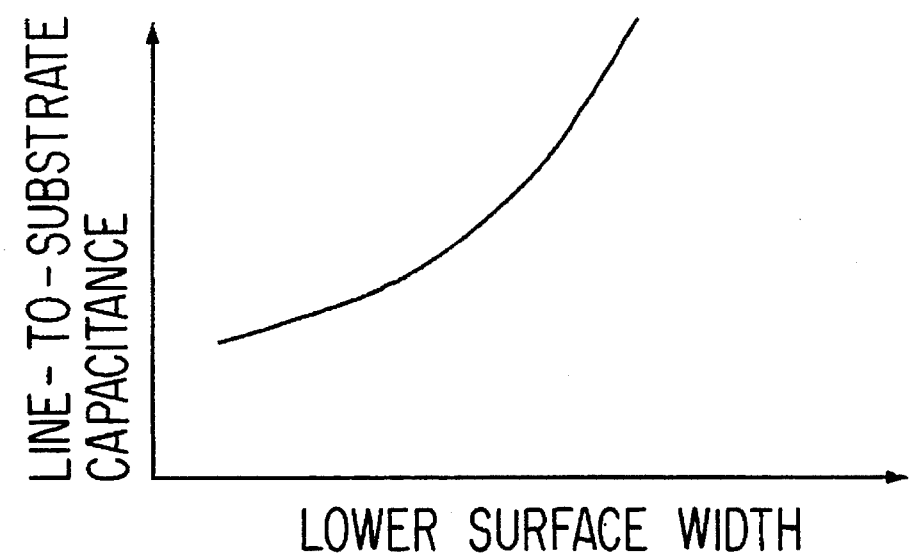
FIG. 4 is a graph showing a line-to-substrate parasitic capacitance versus the lower surface width of a line.

FIG. 4 is a graph showing the line-to-substrate parasitic capacitance versus the lower surface width of the line. It will be apparent from the graph of FIG. 4 that, as the lower surface width decreases, the line-to-substrate parasitic capacitance decreases. The relation between the lower surface width and the adjacent line-to-line parasitic capacitance is similar to the relation shown in FIG. 4.

FIGS. 5 to 12 are cross-sectional views showing a method of fabricating an element-to-element line for the semiconductor integrated circuit device of the first preferred embodiment. Referring to FIGS. 5 to 12, the method will be described hereinafter. It should be noted that the cross sections of FIGS. 5 to 12 as well as FIG. 2 are those taken along the line B—B of FIG. 1.

Figure 5:
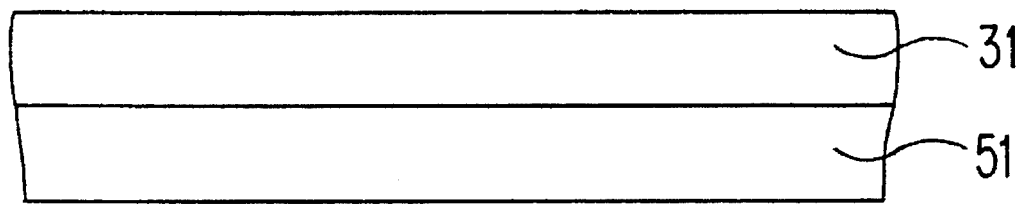
Figure 6:
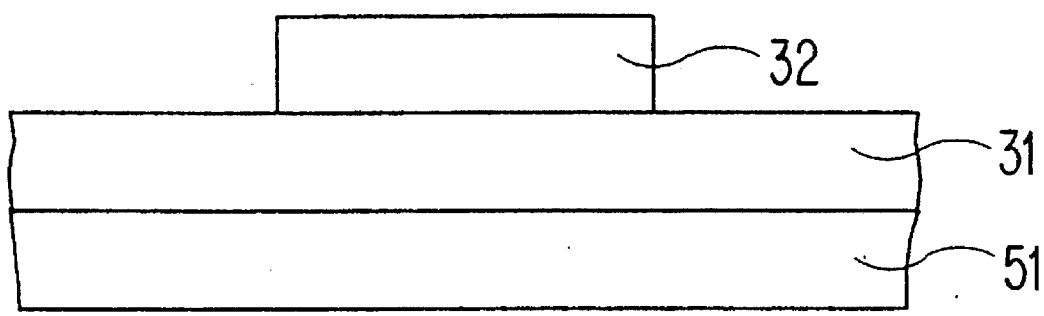

A protective film 51 is formed on the semiconductor substrate 1, and a wiring layer 31 is formed over the protective film 51, as shown in FIG. 5 (although the semiconductor substrate 1 underlying the protective film 51 is not shown). A resist 32 is formed over the wiring layer 31 and is then patterned as shown in FIG. 6.

Figure 7:
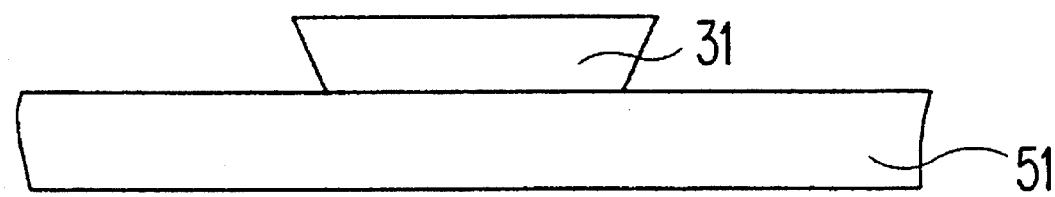

Using the resist 32 as a mask, the wiring layer 31 is etched so as to have a taper from its upper surface to its lower surface, to provide the wiring layer 31 of a configuration such that its corners are chamfered on the slant, as shown in FIG. 7. The resist 32 is then removed.

Figure 8:
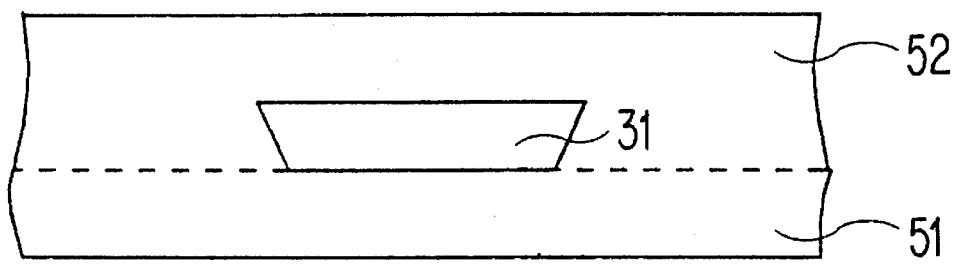
Figure 9:
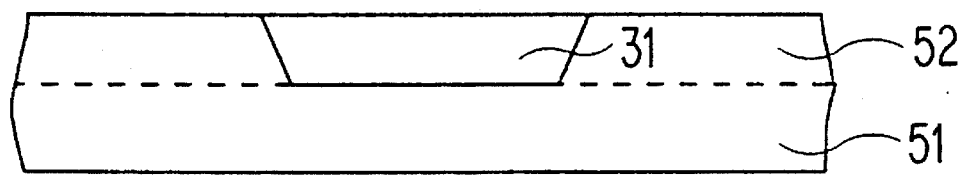

As shown in FIG. 8, a protective film 52 is formed over the protective film 51 and wiring layer 31. The protective film 52 is polished from the top surface to expose the surface of the wiring layer 31, as shown in FIG. 9.

Figure 10:
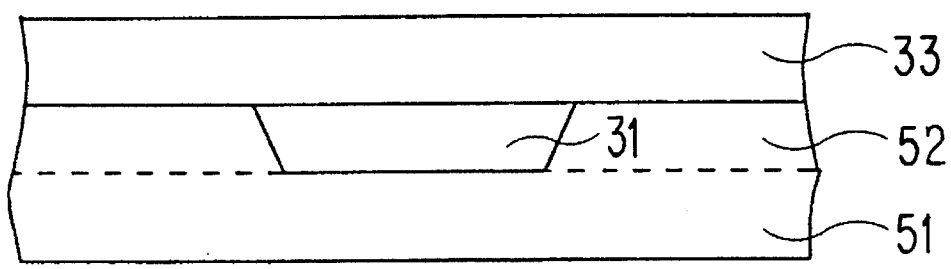
Figure 11:
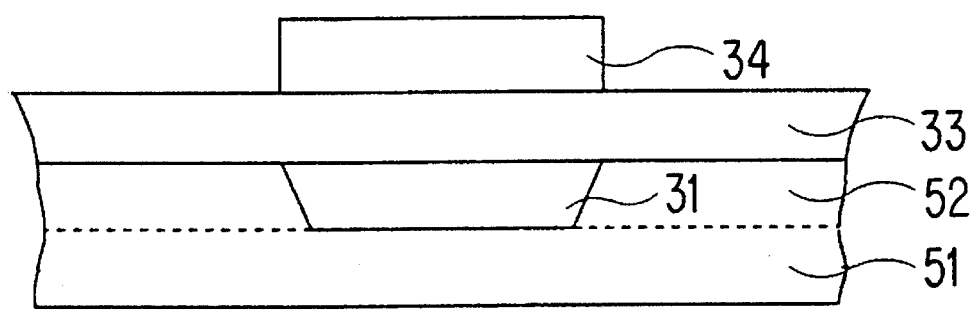

A wiring layer 33 is formed over the protective film 52 and wiring layer 31, as shown in FIG. 10. A resist 34 is firmed over the wiring layer 33 and is patterned to conform to the upper surface configuration of the wiring layer 31, as shown in FIG. 11.

Using the resist 34 as a mask, the wiring layer 33 is vertically etched to make the lower surface of the wiring layer 33 conform to the upper surface of the wiring layer 31, as shown in FIG. 12. The element-to-element line 10A is thus completed.

Although not shown, a protective film is then formed over the top surface, and this protective film and the previously formed protective films 51 and 52 form the protective film 5 of FIG. 1. In the above-mentioned steps, the element-to-element line 10A electrically connects a plurality of semiconductor elements. This is, however, little related to the features of the present invention, and the description thereof will be omitted herein. Similarly, the description of the electrical connection between the plurality of semiconductor elements with the element-to-element line will be omitted in preferred embodiments to be described later.

<Second Preferred Embodiment>

FIG. 13 is a cross-sectional view showing the cross-sectional configuration of the line to be formed in the semiconductor integrated circuit device according to a second preferred embodiment of the present invention. It should be noted that the cross section of FIG. 13 corresponds to that taken along the line B—B of FIG. 1.

An element-to-element line 10B of the second preferred embodiment is of a hexagonal configuration in cross section having horizontal upper and lower surfaces. Other constructions of the second preferred embodiment are identical with those of the first preferred embodiment shown in FIGS. 1 and 2, and the description thereof will be omitted herein.

Such an arrangement permits a longer horizontal distance between the lines and a shorter line height at surfaces S1 adjacent to the lower surface of the element-to-element line 10B and at surfaces S2 adjacent to the upper surface thereof, in the same manner as in the first preferred embodiment. This provides the adjacent line-to-line parasitic capacitance which is lower than that of the prior art line of quadrangular (rectangular) cross-sectional configuration under the same height and line-to-line horizontal distance conditions.

Likewise, the arrangement permits a longer line-to-substrate vertical distance and a shorter line width at the surfaces S1 adjacent the lower surface of the element-to-element line 10B. This provides the line-to-substrate parasitic capacitance which is lower than the prior art line of quadrangular cross-sectional configuration under the same width and line-to-substrate vertical distance conditions.

Furthermore, the arrangement permits a longer vertical distance between the element-to-element line 10B and another overlying line and a shorter line width at the surfaces S2 adjacent the upper surface of the element-to-element line 10B. This provides a multilayer line-to-line parasitic capacitance which is lower than that of the prior art line of quadrangular cross-sectional configuration under the same width and line-to-line vertical distance conditions.

Figure 14:
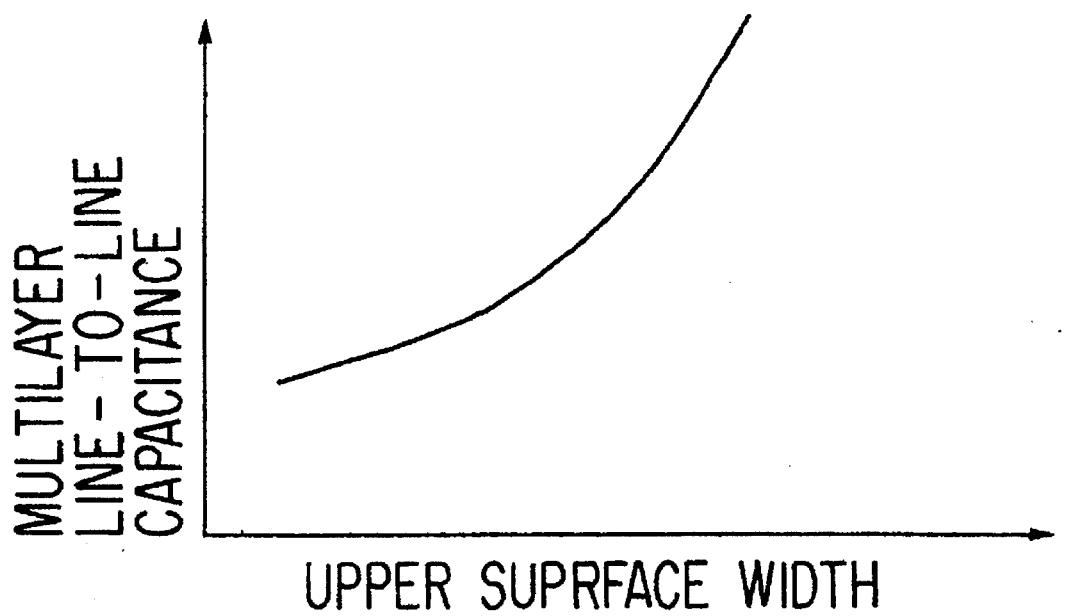
FIG. 14 is a graph showing a multilayer line-to-line parasitic capacitance versus the upper surface width of a line.

FIG. 14 is a graph showing the multilayer line-to-line parasitic capacitance versus the upper surface width of the line. It will be appreciated from FIG. 14 that, as the upper surface width decreases, the multilayer line-to-line parasitic capacitance decreases. The relation between the upper surface width and the adjacent line-to-line parasitic capacitance is similar to the relation shown in FIG. 14.

FIGS. 15 to 22 are cross-sectional views showing a method of fabricating the element-to-element line for the semiconductor integrated circuit device of the second preferred embodiment. Referring to FIGS. 15 to 22, the method will be described hereinafter. It should be noted that the cross sections of FIGS. 15 to 22 correspond to those taken along the line B—B of FIG. 1.

Figure 15:
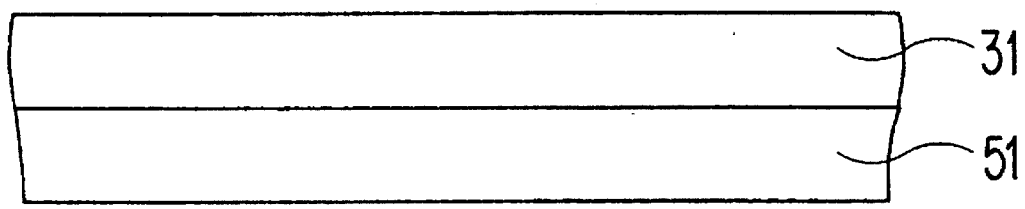
FIGS. 15 to 22 are cross-sectional views showing the method of fabricating the line in the semiconductor integrated circuit device of the second preferred embodiment.
Figure 16:
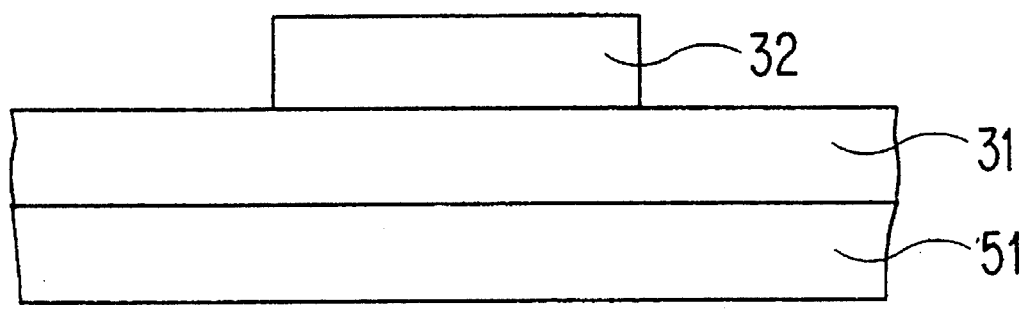

The protective film 51 is formed on the semiconductor substrate 1, and the wiring layer 31 is formed over the protective film 51, as shown in FIG. 15 (although the semiconductor substrate 1 underlying the protective film 51 is not shown). The resist 32 is formed over the wiring layer 31 and is then patterned as shown in FIG. 16.

Figure 17:
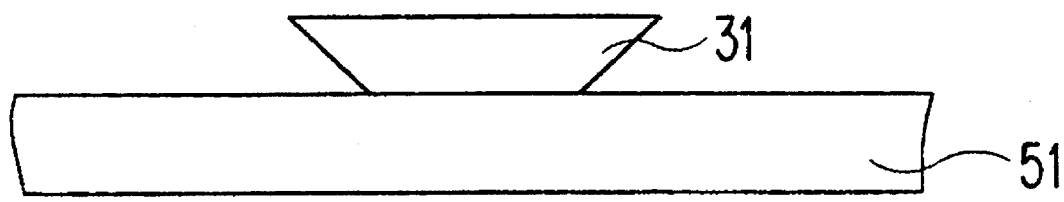

Using the resist 32 as a mask, the wiring layer 31 is etched so as to have a taper from its upper surface to its lower surface, to provide the downwardly tapered wiring layer 31, as shown in FIG. 17. The resist 32 is then removed.

Figure 18:
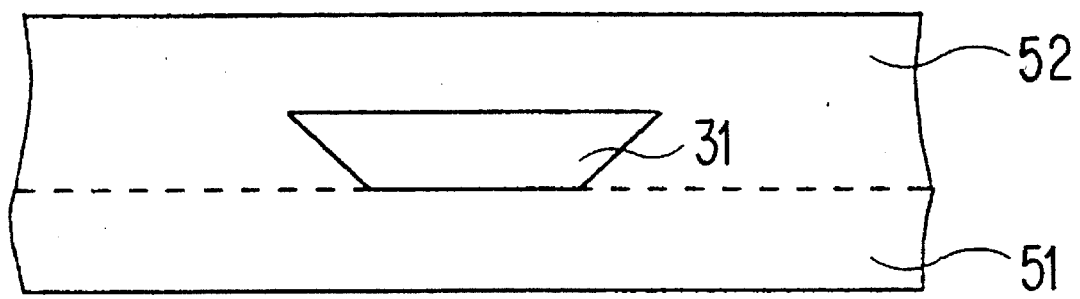
Figure 19:
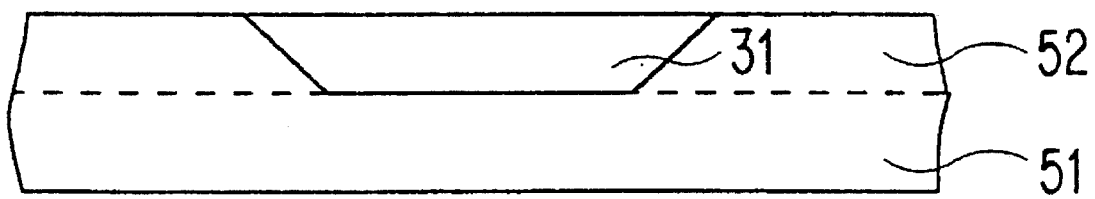

The protective film 52 is formed over the protective film 51 and wiring layer 31, as shown in FIG. 18. The protective film 52 is polished from the top surface to expose the surface of the wiring layer 31, as shown in FIG. 19.

Figure 20:
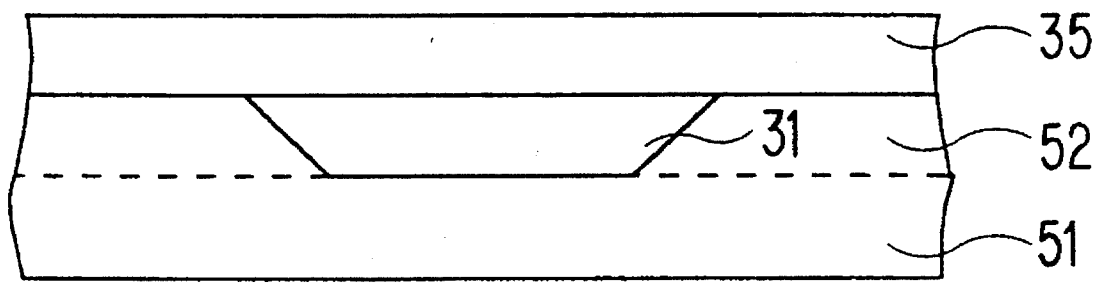
Figure 21:
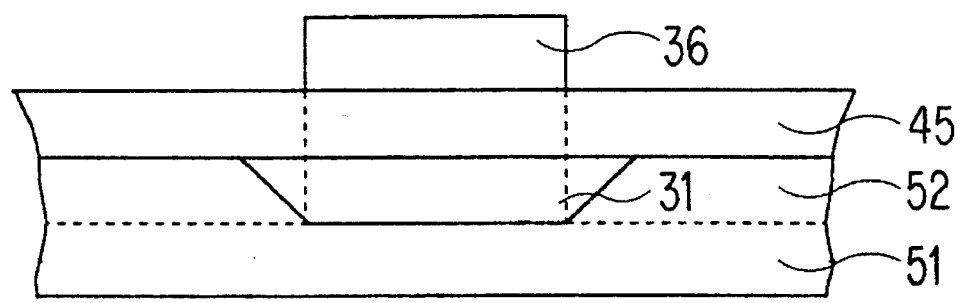

A wiring layer 35 is formed over the protective film 52 and wiring layer 31, as shown in FIG. 20. A resist 36 is formed over the wiring layer 35 and is patterned to conform to the lower surface configuration of the wiring layer 31, as shown in FIG. 21.

Figure 22:
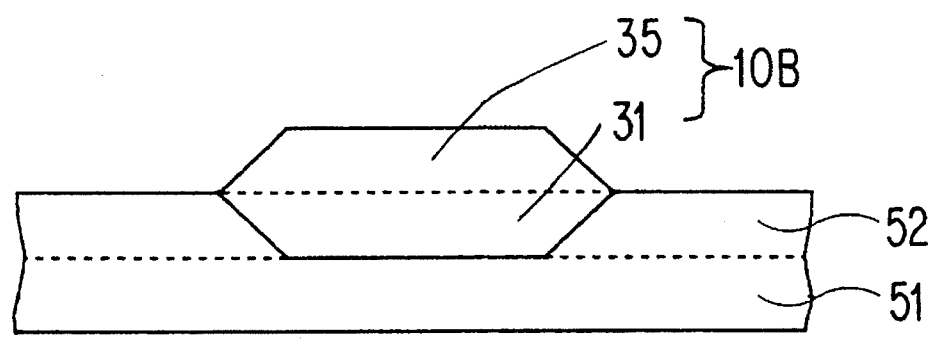

Using the resist 36 as a mask, the wiring layer 35 is etched so as to taper from its lower surface to its upper surface to make the lower surface of the wiring layer 35 conform to the upper surface of the wiring layer 31. The element-to-element line 10B of hexagonal cross-sectional configuration is thus completed, as shown in FIG. 22.

<Third Preferred Embodiment>

Figure 23:
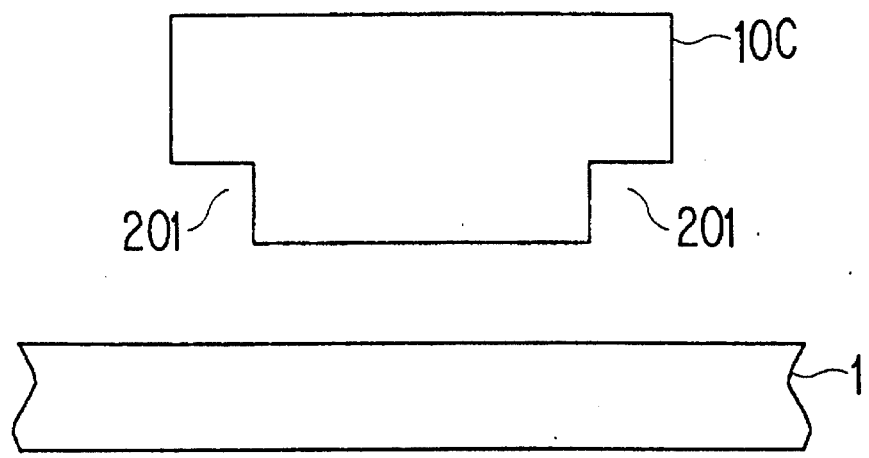
FIG. 23 is a cross-sectional view showing the cross-sectional configuration of the element-to-element line for the semiconductor integrated circuit device according to a third preferred embodiment of the present invention.

FIG. 23 is a cross-sectional view showing the cross-sectional configuration of the line to be formed in the semiconductor integrated circuit device according to a third preferred embodiment of the present invention. It should be noted that the cross section of FIG. 23 corresponds to that taken along the line B—B of FIG. 1.

An element-to-element line 10C of the third preferred embodiment is of a quadrangular (rectangular) configuration in cross section having horizontal upper and lower surfaces, with its lower surface corners removed at right angles, as shown in FIG. 23. Other constructions of the third preferred embodiment are identical with those of the first preferred embodiment shown in FIGS. 1 and 2, and the description thereof will be omitted herein.

Such an arrangement permits a longer horizontal distance between the lines and a shorter line height in removal potions 201 at the lower surface of the element-to-element line 10C, in the same manner as in the first preferred embodiment. This provides the adjacent line-to-line parasitic capacitance which is lower than that of the prior art line of quadrangular (rectangular) cross-sectional configuration under the same height and line-to-line horizontal distance conditions.

Likewise, the arrangement permits a longer line-to-substrate vertical distance and a shorter line width in the removal portions 201 at the lower surface of the element-to-element line 10C. This provides the line-to-substrate parasitic capacitance which is lower than that of the prior art line of quadrangular cross-sectional configuration under the same width and line-to-substrate vertical distance conditions.

FIGS. 24 to 27 are cross-sectional views showing a method of fabricating the element-to-element line in the semiconductor integrated circuit device of the third preferred embodiment. Referring to FIGS. 24 to 27, the method will be described hereinafter. It should be noted that the cross sections of FIGS. 24 to 27 as well as FIG. 23 correspond to those taken along the line B—B of FIG. 1.

Figure 24:
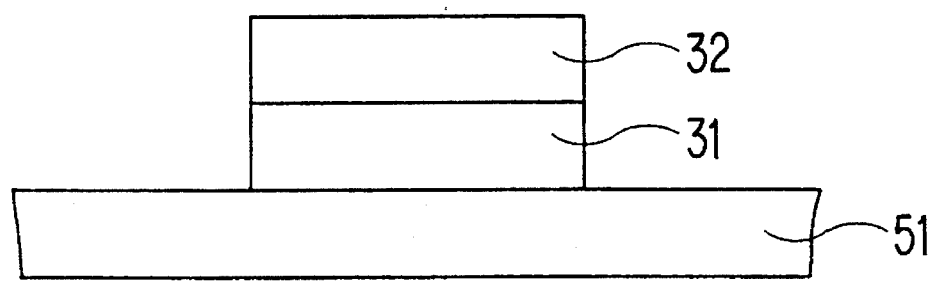

The protective film 51 is formed on the semiconductor substrate 1, and the wiring layer 31 is formed over the protective film 51 (although the semiconductor substrate 1 underlying the protective film 51 is not shown). The resist 32 is formed over the wiring layer 31 and is patterned. Using the patterned resist 32 as a mask, the wiring layer 31 is vertically etched to be patterned as shown in FIG. 24. The resist 32 is then removed.

Figure 25:
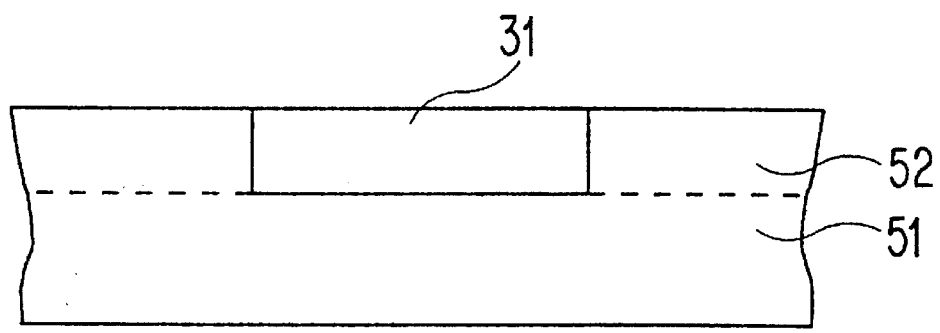

The protective film 52 is formed over the top surface and is polished from the top surface to expose the surface of the wiring layer 31, as shown in FIG. 25.

Figure 26:
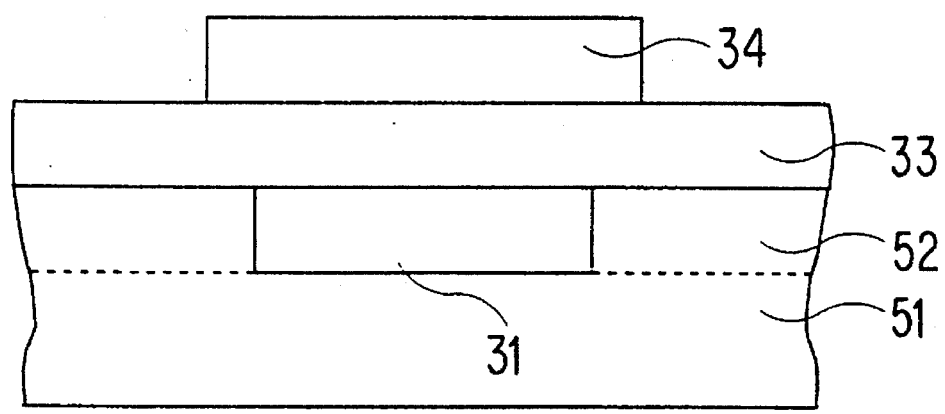

The wiring layer 33 is formed over the top surface, and the resist 34 is patterned to be wider than the wiring layer 31, as shown in FIG. 26.

Using the resist 34 as a mask, the wiring layer 33 is vertically etched to form recesses at right angles between the wiring layers 33 and 31. This provides the element-to-element line 10C of a cross-sectional configuration such that the lower surface corners are removed at right angles from the quadrangle having the horizontal upper and lower surfaces.

<Fourth Preferred Embodiment>

FIG. 28 is a cross-sectional view showing the cross-sectional configuration of the line to be formed in the semiconductor integrated circuit device according to a fourth preferred embodiment of the present invention. It should be noted that the cross section of FIG. 28 corresponds to that taken along the line B—B of FIG. 1.

An element-to-element line 10D of the further preferred embodiment is of a quadrangular configuration in cross section having horizontal upper and lower surfaces, with its upper surface corners removed at right angles, as shown in FIG. 28. Other constructions of the fourth preferred embodiment arc identical with those of the first preferred embodiment shown in FIGS. 1 and 2, and the description thereof will be omitted herein.

Such an arrangement permits a longer horizontal distance between the lines and a shorter line height in removal portions 202 at the upper surface of the element-to-element line 10D, in the same manner as in the first preferred embodiment. This provides the adjacent line-to-line parasitic capacitance which is lower than that of the prior art line of quadrangular cross-sectional configuration under the same height and line-to-line horizontal distance conditions.

Likewise, the arrangement permits a longer vertical distance between the lines and a shorter line width in the removal portions 202 at the upper surface of the element-to-element line 10D. This provides the multilayer line-to-line parasitic capacitance which is lower than that of the prior art line of quadrangular (rectangular) cross-sectional configuration under the same width and line-to-line vertical distance conditions.

Figure 29:
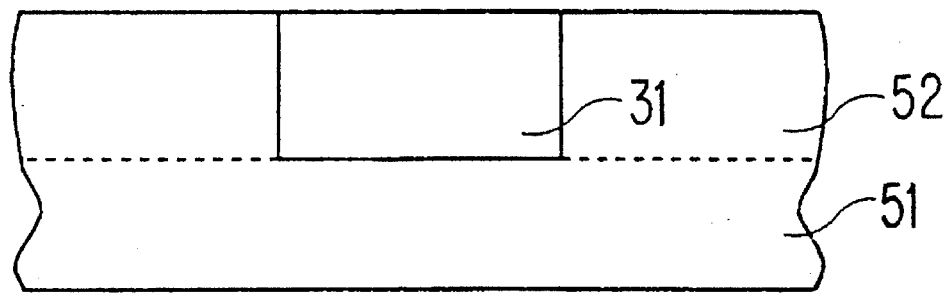
FIGS. 29 to 31 are cross-sectional views showing a first method of fabricating the line in the semiconductor integrated circuit device of the fourth preferred embodiment.
Figure 30:
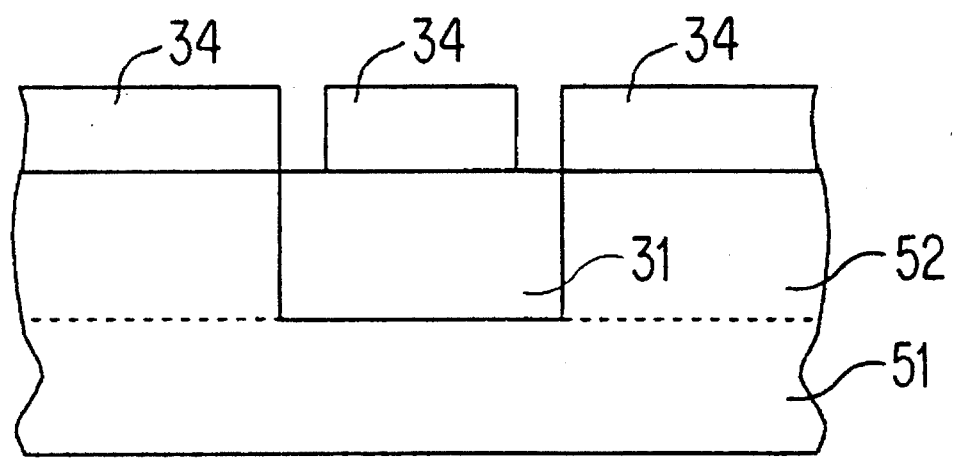
Figure 31:
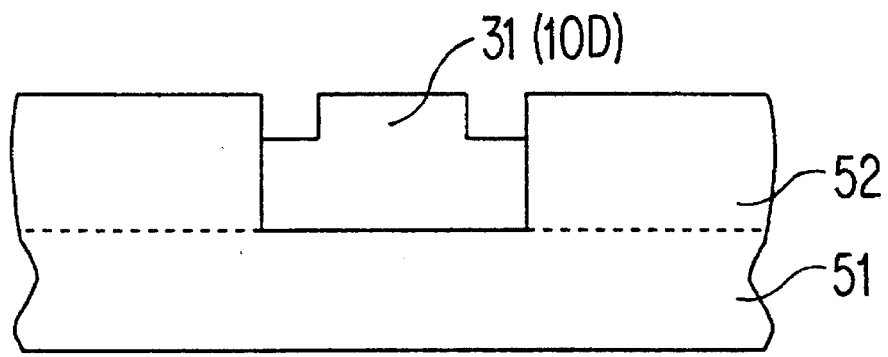

FIGS. 29 to 31 are cross-sectional views showing a method of fabricating the element-to-element line in the semiconductor integrated circuit device of the fourth preferred embodiment. Referring to FIGS. 29 to 31, the method will be described hereinafter. It should be noted that the cross sections of FIGS. 29 to 31 as well as FIG. 28 correspond to those taken along the line B—B of FIG. 1.

In the same manner as in the third preferred embodiment, the relatively thick wiring layer 31 formed on the protective film 51 is patterned. The protective film 52 is formed over the top surface and is polished from the top surface to expose the surface of the wiring layer 31, as shown in FIG. 29.

The resist 34 is formed over the top surface and is patterned so as to permit only the end portions of the wiring layer 31 to be exposed, as shown in FIG. 30.

Using the resist 34 as a mask, the wiring layer 31 is vertically etched down to a depth in the middle of the wiring layer 31, to provide the element-to-element line 10D of a cross-sectional configuration such that the upper surface corners of the wiring layer 31 arc removed at right angles.

FIGS. 32 to 35 are cross-sectional views showing a second method of fabricating the element-to-element line in the semiconductor integrated circuit device of the fourth preferred embodiment. Referring to FIGS. 32 to 35, the second method will be described hereinafter. It should be noted that the cross sections of FIGS. 32 to 35 correspond to those taken along the line B—B of FIG. 1.

Figure 32:
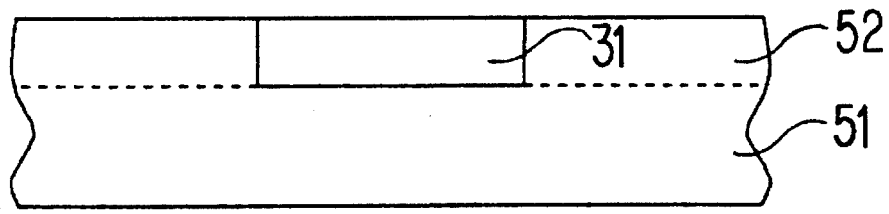
FIGS. 32 to 35 are cross-sectional views showing a second method of fabricating the line in the semiconductor integrated circuit device of the fourth preferred embodiment.

In the same manner as in the third preferred embodiment, the relatively thin wiring layer 31 formed on the protective film 51 is patterned. The protective film 52 is formed over the top surface and is polished from the top surface to expose the surface of the wiring layer 31, as shown in FIG. 32.

Figure 33:
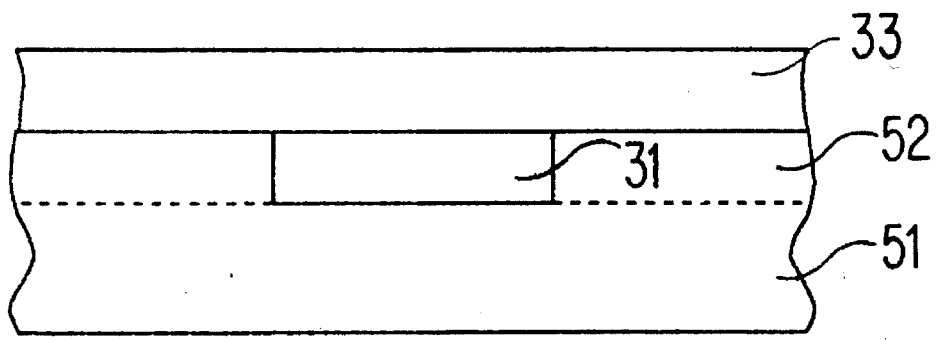
Figure 34:
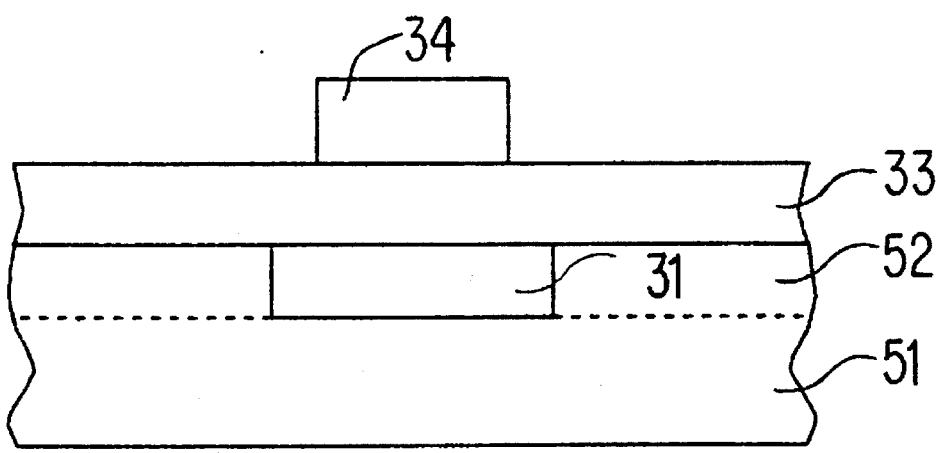
Figure 35:
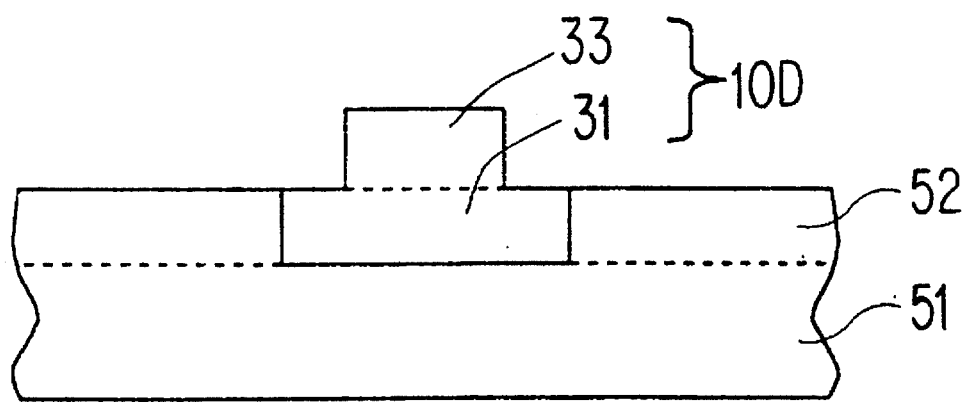

The wiring layer 33 is formed over the protective film 52 and wiring layer 31, as shown in FIG. 33. The resist 34 is formed over the top surface and is patterned so as to be left only above a central region of the wiring layer 31 which is other than end regions of the wiring layer 31, as shown in FIG. 34.

Using the resist 34 as a mask, the wiring layer 33 is vertically etched and the resist 34 is removed, to provide the element-to-element line 10D which includes the wiring layers 31 and 33 and which is of a cross-sectional configuration such that the upper surface corners are removed at right angles.

FIGS. 36 to 40 are cross-sectional views showing a third method of fabricating the element-to-element line in the semiconductor integrated circuit device of the fourth preferred embodiment. Referring to FIGS. 36 to 40, the third method will be described hereinafter. It should be noted that the cross sections of FIGS. 36 to 40 as well as FIG. 28 correspond to those taken along the line B—B of FIG. 1.

Figure 36:
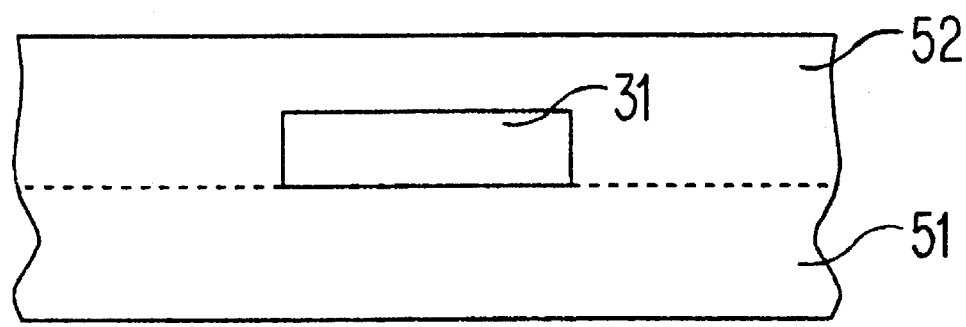
FIGS. 36 to 40 are cross-sectional views showing a third method of fabricating the line in the semiconductor integrated circuit device of the fourth preferred embodiment.

In the same manner as in the third preferred embodiment, the relatively thin wiring layer 31 formed on the protective film 51 is patterned, and the protective film 52 is formed over the top surface, as shown in FIG. 36.

Figure 37:
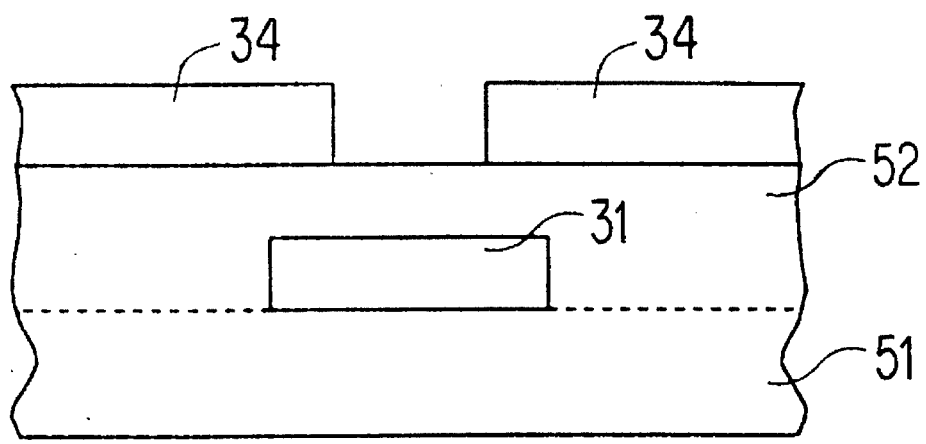

The resist 34 is formed over the top surface and is then patterned to be removed only in a region above the central region of the wiring layer 31 which is other than the end regions of the wiring layer 31, as shown in FIG. 37.

Figure 38:
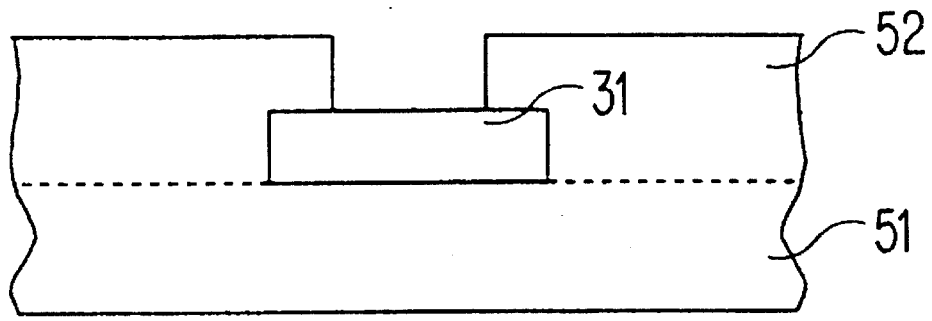

Using the resist 34 as a mask, the protective film 52 is vertically etched until the surface of the wiring layer 31 is exposed, as shown in FIG. 38. The resist 34 is then removed.

Figure 39:
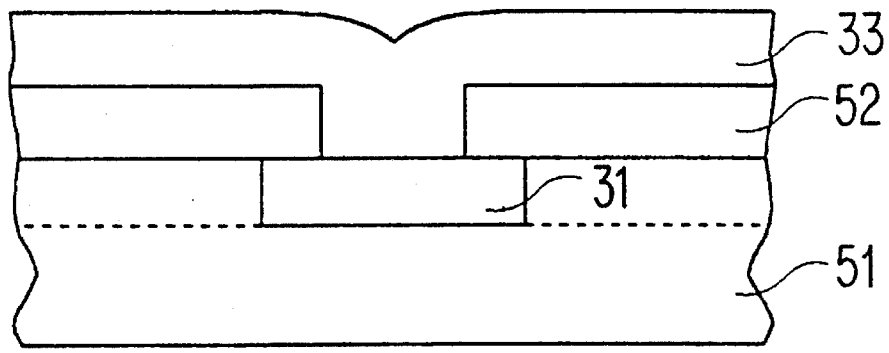
Figure 40:
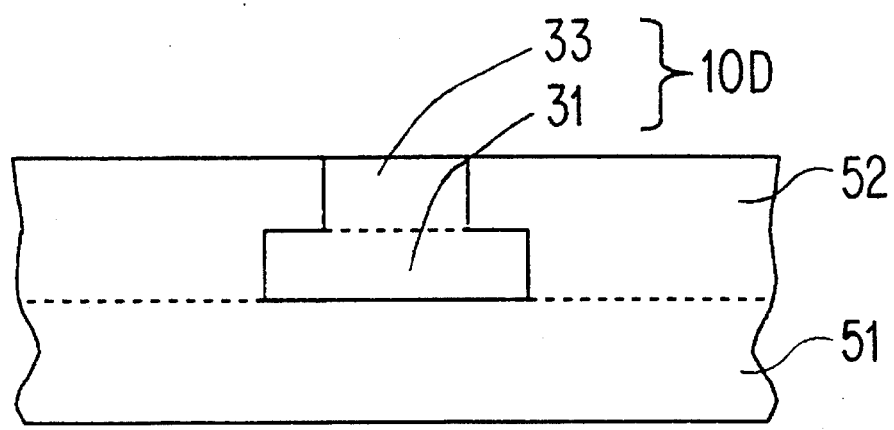

The wiring layer 33 is formed over the top surface as shown in FIG. 39 and is polished from the top surface to a depth which permits the protective film 52 to be exposed as shown in FIG. 40. This provides the element-to-element line 10D which includes the wiring layer 31 and the remaining wiring layer 33 and which is of a cross-sectional configuration such that the upper surface corners are removed at right angles.

<Fifth Preferred Embodiment>

FIG. 41 is a cross-sectional view showing the cross-sectional configuration of the line to be formed in the semiconductor integrated circuit device according to a fifth preferred embodiment of the present invention. It should be noted that the cross section of FIG. 41 corresponds to that taken along the line B—B of FIG. 1.

An element-to-element line 10E of the fifth preferred embodiment is of a quadrangular (rectangular) configuration in cross section having horizontal upper and lower surfaces, with its upper and lower surface corners removed at right angles, as shown in FIG. 41. Other constructions of the fifth preferred embodiment are identical with those of the first preferred embodiment shown in FIGS. 1 and 2 and the description thereof will be omitted herein.

Such an arrangement permits a longer horizontal distance between the lines and a shorter line height in the removal portions 201 and 202 at the lower and upper surfaces of the element-to-element line 10E, in the same manner as in the first preferred embodiment. This provides the adjacent line-to-line parasitic capacitance which is lower than that of the prior art line of quadrangular cross-sectional configuration under the same height and line-to-line horizontal distance conditions.

Likewise, the arrangement permits a longer vertical distance between the line and the substrate and a shorter line width in the removal portions 201 at the lower surface of the element-to-element line 10E. This provides the line-to-substrate parasitic capacitance which is lower than that of the prior art line of quadrangular cross-sectional configuration under the same width and line-to-substrate vertical distance conditions.

Further, the arrangement permits a longer vertical distance between the lines and a shorter line width in the removal portions 202 at the upper surface of the element-to-element line 10E. This provides the multilayer line-to-line parasitic capacitance which is lower than that of the prior art line of quadrangular cross-sectional configuration under the same width and line-to-line vertical distance conditions.

FIGS. 42 to 46 are cross-sectional views showing a method of fabricating the element-to-element line in the semiconductor integrated circuit device of the fifth preferred embodiment. Referring to FIGS. 42 to 46, the method will be described hereinafter. It should be noted that the cross sections of FIGS. 42 to 46 as well as FIG. 41 correspond to those taken along the line B—B of FIG. 1.

Figure 43:
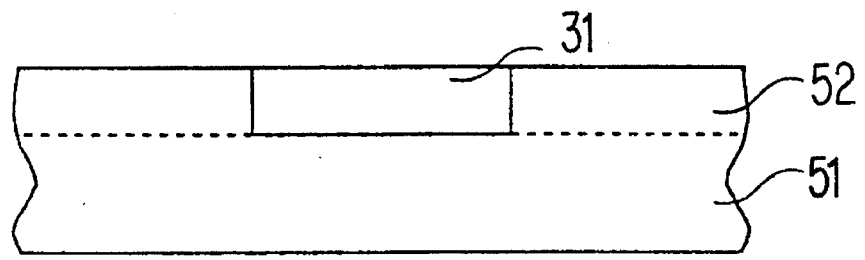

In the same manner as in the third preferred embodiment, the patterned wiring layer 31 is formed on the protective film 51, and the protective film 52 is formed over the protective film 51 and the wiring layer 31, as shown in FIG. 42. The protective film 52 is polished from the top surface to expose the surface of the wiring layer 31, as shown in FIG. 43.

Figure 44:
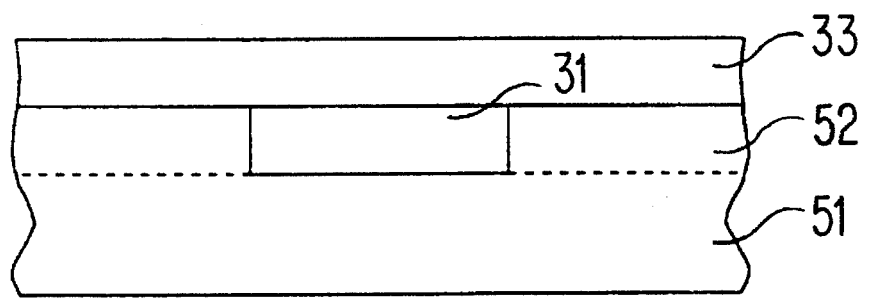
Figure 45:
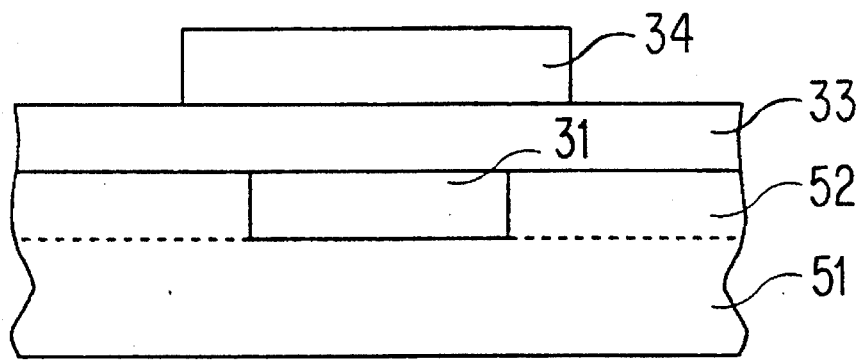

The wiring layer 33 is formed over the top surface, as shown in FIG. 44, and the resist 34 is formed on the wiring layer 33 and is patterned to be wider than the wiring layer 31, as shown in FIG. 45.

Figure 46:
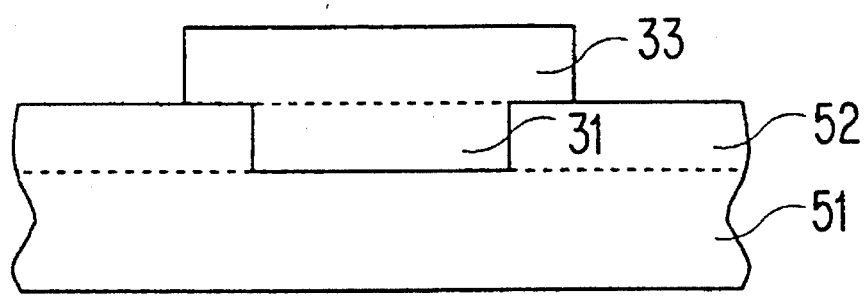

Using the resist 34 as a mask, the wiring layer 33 is vertically etched and the resist 34 is then removed, to form recesses at right angles between the wiring layers 33 and 31, as shown in FIG. 46.

Although not shown, the element-to-element line 10E of a configuration such that the upper and lower surface corners are removed at right angles is consequently formed, as shown in FIG. 41, by using any of the first to third methods of the fourth preferred embodiment.

<Sixth Preferred Embodiment>

Figure 47:
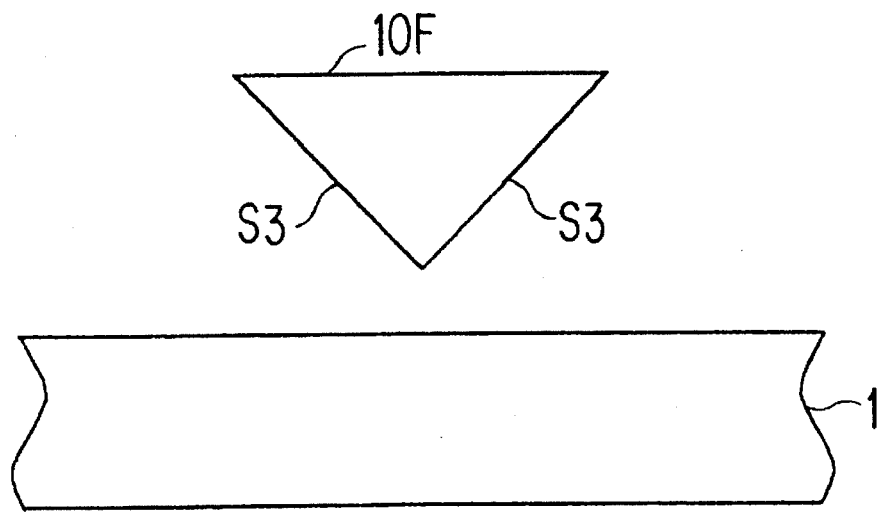
FIG. 47 is a cross-sectional view showing the cross-sectional configuration of the element-to-element line for the semiconductor integrated circuit device according to a sixth preferred embodiment of the present invention.

FIG. 47 is a cross-sectional view showing the cross-sectional configuration of the line to be formed in the semiconductor integrated circuit device according to a sixth preferred embodiment of the present invention. It should be noted that the cross section of FIG. 47 corresponds to that taken along the line B—B of FIG. 1.

An element-to-element line 10F of the sixth preferred embodiment is of an inverted triangular configuration in cross section having an upper surface serving as a horizontal base and a vertex therebelow. Other constructions of the sixth preferred embodiment are identical with those of the first preferred embodiment shown in FIGS. 1 and 2, and the description thereof will be omitted herein.

Such an arrangement permits a longer horizontal distance between the lines and a shorter line height at first and second slanting surfaces S3 between the upper and lower surfaces of the element-to-element line 10F. This provides the adjacent line-to-line parasitic capacitance which is lower than that of the prior art line of quadrangular (rectangular) cross-sectional configuration under the same line height and line-to-line horizontal distance conditions.

Likewise, the arrangement permits a longer vertical distance between the line and the substrate and a shorter line width at the first and second slanting surfaces S3 between the upper and lower surfaces of the element-to-element line 10F. This provides the line-to-substrate parasitic capacitance which is lower than that of the prior art line of quadrangular cross-sectional configuration under the same width and line-to-substrate vertical distance conditions.

FIGS. 48 to 53 are cross-sectional views showing a method of fabricating the element-to-element line in the semiconductor integrated circuit device of the sixth preferred embodiment. Referring to FIGS. 48 to 53, the method will be described hereinafter. It should be noted that the cross sections of FIGS. 48 to 52 as well as FIG. 47 correspond to those taken along the line B—B of FIG. 1.

Figure 48:
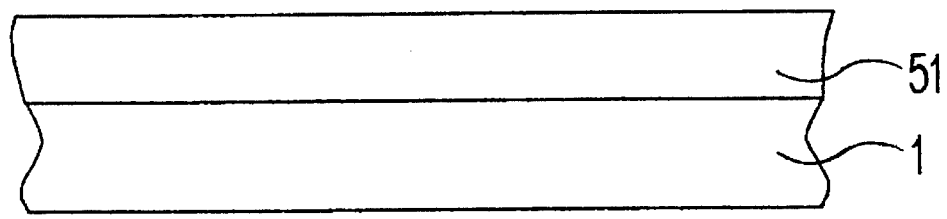
FIGS. 48 to 53 are cross-sectional views showing the method of fabricating the line in the semiconductor integrated circuit device of the sixth preferred embodiment.
Figure 49:
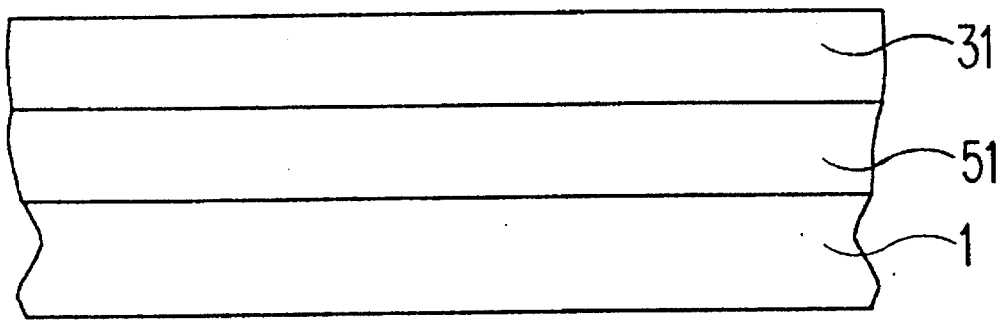
Figure 50:
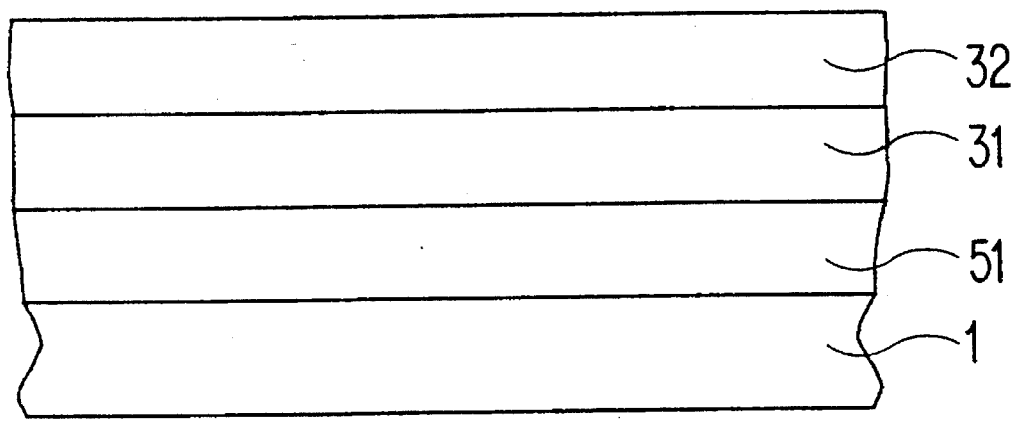
Figure 51:
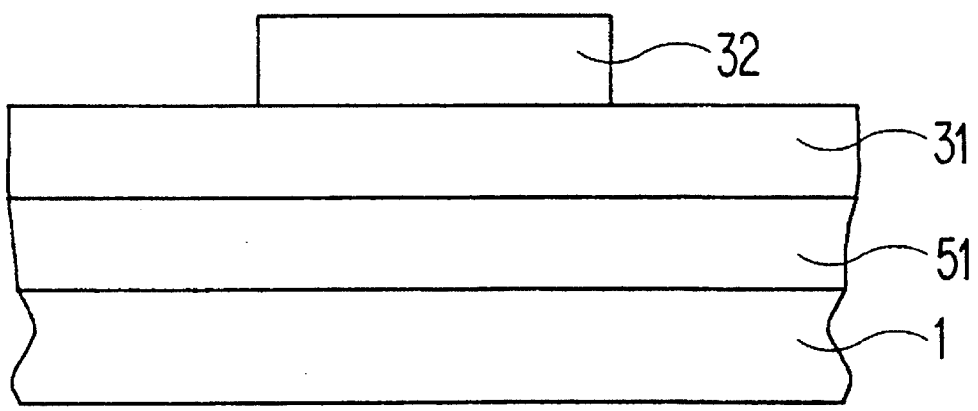

The protective film 51 is formed on the semiconductor substrate 1 as shown in FIG. 48, and the wiring layer 31 is formed on the protective film 51 as shown in FIG. 49. The resist 32 is formed on the wiring layer 31 as shown in FIG. 50 and is then patterned as shown in FIG. 51.

Figure 52:
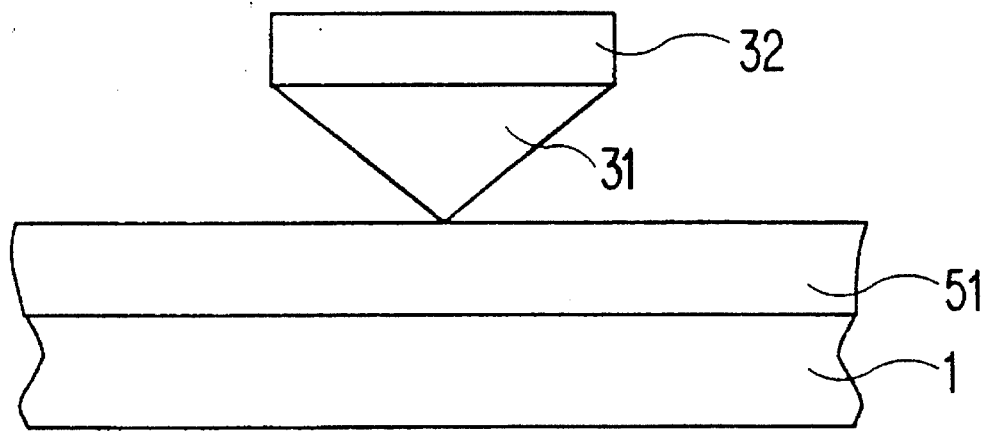

Using the resist 32 as a mask, the wiring layer 31 is etched to be acutely tapered from its upper surface to its lower surface such that a great part of the lower surface of the wiring layer 31 is removed to form the vertex of the triangle as shown in FIG. 52.

Figure 53:
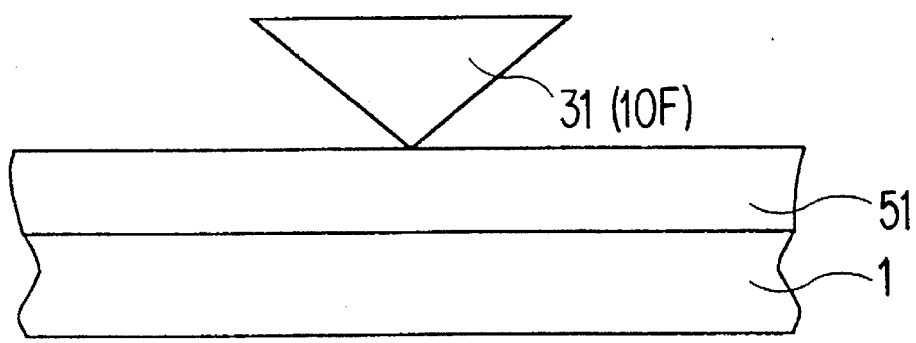

The resist 32 is removed as shown in FIG. 53. The etched wiring layer 31 forms the element-to-element line 10F of inverted triangular configuration in cross section.

A second method of fabricating the element-to-element line of the sixth preferred embodiment will be discussed hereinafter. The steps of FIGS. 48 to 51 are identical with those of the first method. The differences are as follows.

Figure 54:
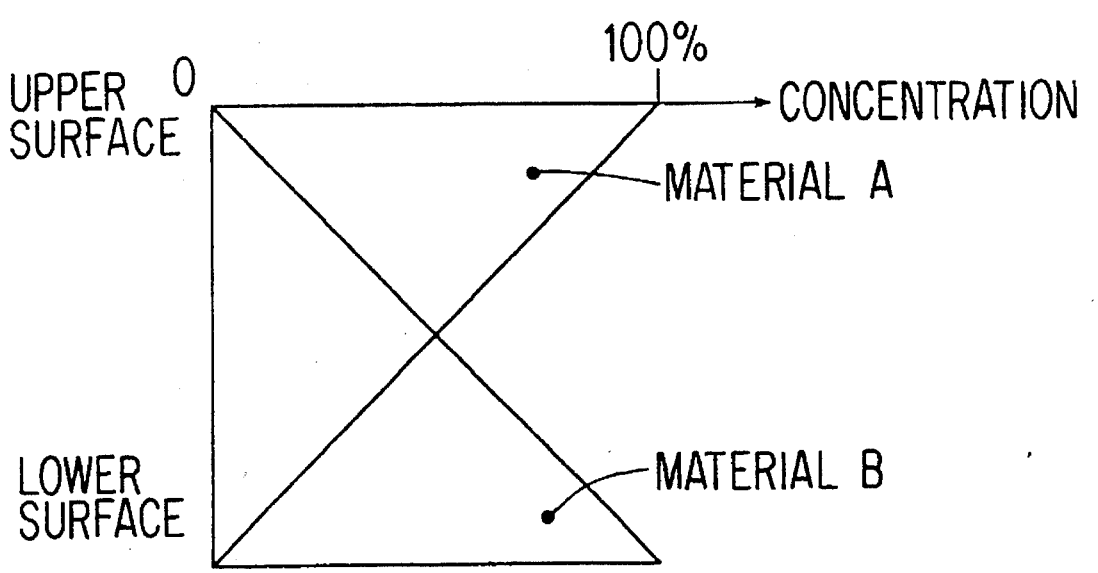
FIG. 54 is a graph showing the blend distribution of a wiring layer from upper to lower surfaces in the method of the sixth preferred embodiment.
Figure 55:
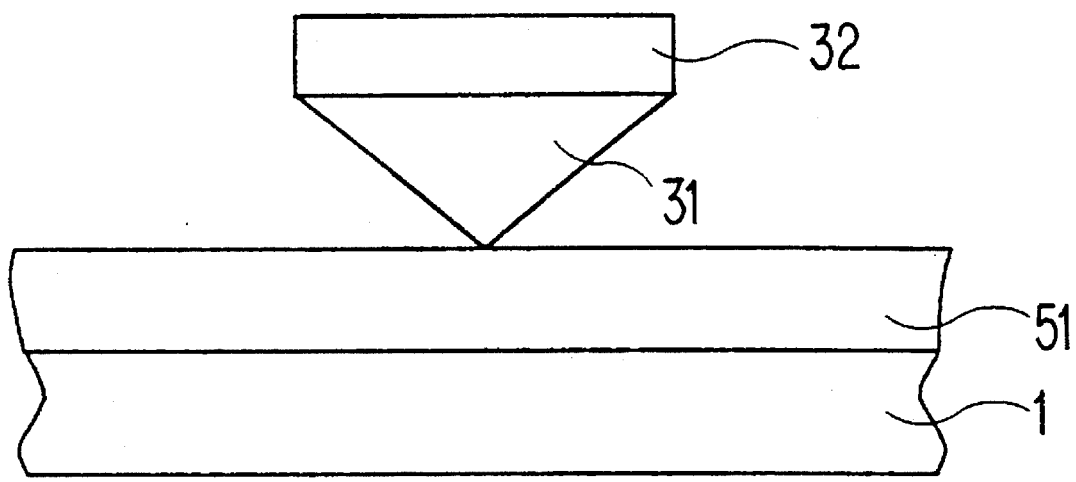
FIG. 55 is a cross-sectional view showing the method of fabricating the line in the semiconductor integrated circuit device of the sixth preferred embodiment.
Figure 56:
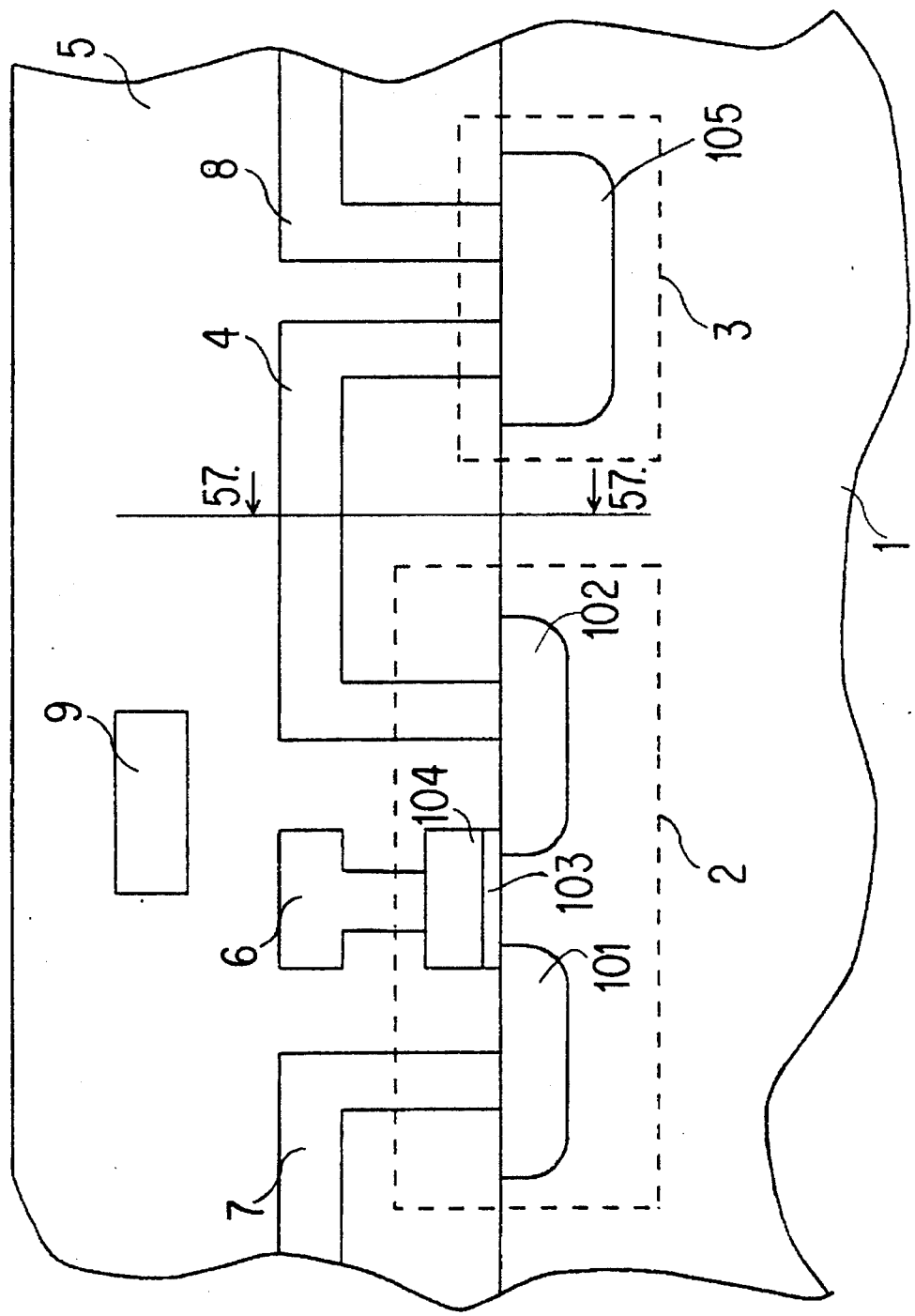
FIG. 56 is a cross-sectional view of a portion of a conventional semiconductor integrated circuit device.
Figure 57:
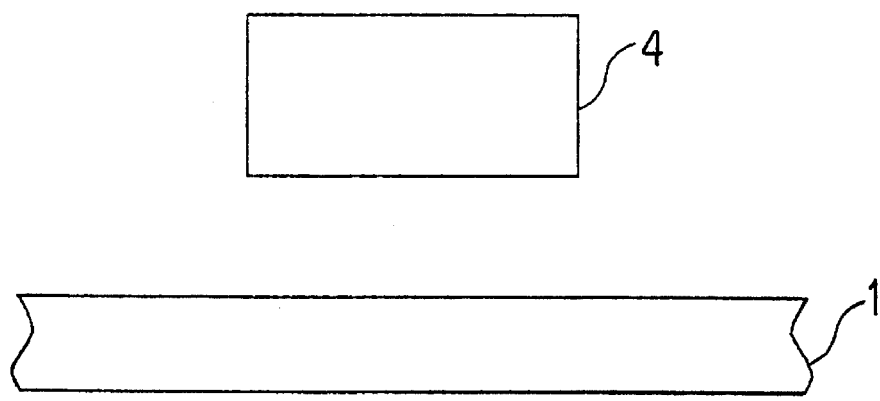
FIG. 57 is a cross-sectional view showing the cross-sectional configuration of an element-to-element line fir the conventional semiconductor integrated circuit device.
Figure 58:
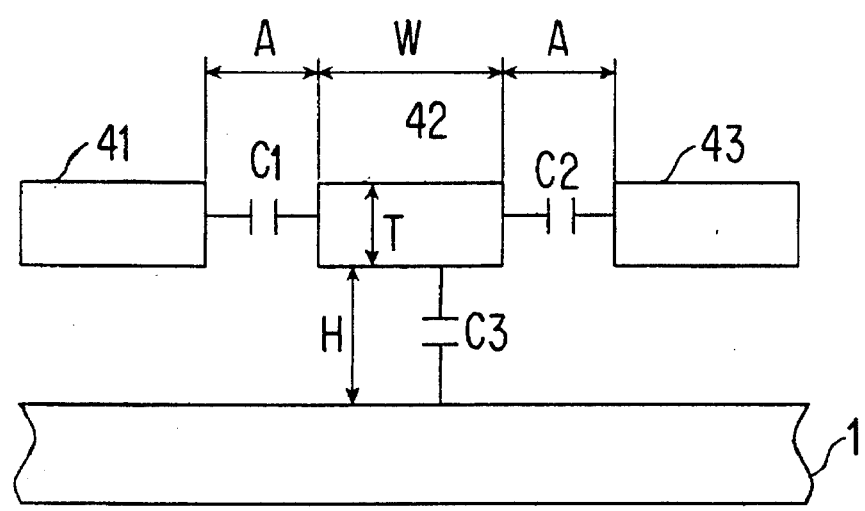
FIG. 58 illustrates parasitic capacitances generated by forming lines in the conventional semiconductor integrated circuit device.

Two different materials A and B are mixed to form the wiring layer 31 by using sputtering or the like. The blend ratio of the material A to the material B between the upper and lower surfaces of the wiring layer 31 is shown in FIG. 54.

Masked with the resist 32, the wiring layer 31 is etched by using an etchant effective for only the material B. Because of the blend ratio of the material A to the material B, the wiring layer 31 on the upper surface side is scarcely etched but is etched in larger amounts in the downward direction until the great part of the lower surface of the wiring layer 31 is etched. The wiring layer 31 is etched into a cross-sectional configuration such that the vertex of the triangle is formed at the lower surface of the wiring layer 31 to finally provide the element-to-element line 10F of inverted triangular cross-sectional configuration.

While the invention has been shown and described in detail, the foregoing description is in all aspects illustrative and not restrictive. It is therefore understood that numerous modifications and variations can be devised without departing from the scope of the invention.

What is claimed is:

1. A semiconductor integrated circuit device including a plurality of semiconductor elements formed on a semiconductor substrate, said semiconductor integrated circuit device comprising:

an element-to-element line for electrically connecting said plurality of semiconductor elements to each other, said element-to-element line being of a quadrangular configuration in cross section having upper and lower corner portions and having horizontal upper and lower surfaces and having rectangular portions removed at the lower corners.

2. A semiconductor integrated circuit device including a plurality of semiconductor elements formed on a semiconductor substrate, said semiconductor integrated circuit device comprising:

an element-to-element line for electrically connecting said plurality of semiconductor elements to each other, said element-to-element line being formed of a first rectangular layer of a first predetermined size and of a second rectangular layer of a second predetermined size which is less than the first predetermined size.

3. A semiconductor integrated circuit device including a plurality of semiconductor elements formed on a semiconductor substrate, said semiconductor integrated circuit device comprising:

an element-to-element line for electrically connecting said plurality of semiconductor elements to each other said element-to-element line being formed of eight sides including first and second parallel sides separated by a first distance, third and fourth parallel sides which are perpendicular to the first and second sides and are separated by a second distance, fifth and sixth parallel sides which are perpendicular to the first and second sides and are separated by a third distance which is less than the second distance, and seventh and eighth sides connecting respectively the third side to the fifth side and the fourth side to the sixth side.

* * * * *